United States Patent  (10) Patent No.: US 12,235,292 B2
Pal et al.  (45) Date of Patent: Feb. 25, 2025

(54) TIME-SYNCHRONIZED MICRO-CPoW MEASUREMENT DEVICE

(71) Applicants: Anamitra Pal, Tempe, AZ (US); John Patterson, Tempe, AZ (US)

(72) Inventors: Anamitra Pal, Tempe, AZ (US); John Patterson, Tempe, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 161 days.

(21) Appl. No.: 17/929,150

(22) Filed: Sep. 1, 2022

(65) Prior Publication Data
US 2023/0078917 A1 Mar. 16, 2023

Related U.S. Application Data

(60) Provisional application No. 63/243,864, filed on Sep. 14, 2021.

(51) Int. Cl.
*G01R 19/25* (2006.01)
*G01R 19/00* (2006.01)
(Continued)

(52) U.S. Cl.
CPC ..... *G01R 19/0092* (2013.01); *G01R 19/1659* (2013.01); *G01R 19/2513* (2013.01); *H02J 50/001* (2020.01)

(58) Field of Classification Search
CPC ............ G01R 19/0092; G01R 19/1659; G01R 19/2513; H02J 50/001
See application file for complete search history.

(56) References Cited

U.S. PATENT DOCUMENTS 6,590,754 B1 * 7/2003 Macbeth .............. H02H 1/0015
324/536
9,882,428 B2 * 1/2018 Calhoun ................. H02J 50/00
(Continued)

OTHER PUBLICATIONS

Mbed TLS. [Online]. Available: https://en.wikipedia.org/wiki/Mbed_TLS. 2009.

(Continued)

*Primary Examiner* — Dominic E Hawkins
(74) *Attorney, Agent, or Firm* — Riverside Law LLP

(57) ABSTRACT

A time-synchronized micro-scale continuous point-on-wave (CPoW) measurement device, referred to as micro-CPoW, is provided. The distribution system is an integral part of the electric power system, but not much is known about how it behaves in real-time. To address this knowledge gap, a low-cost, time-synchronized, CPoW measurement system is designed, built, and characterized herein. The purpose of the micro-CPoW measurement device is to monitor the instantaneous electric current flowing through a distribution line in real time. Detection of harmonics, identification of incipient fault conditions, and general power quality monitoring are typical uses for the measured information. Because the micro-CPoW measurement device is self-powered by the line current and communicates wirelessly, it can be installed without ground-mounted instrument transformers, low-voltage power sources, or communications cabling. Thus, this particular design of CPoW module is intended to be installed directly on a power line without the need for external support equipment.

19 Claims, 12 Drawing Sheets

(51) Int. Cl.
  *G01R 19/165* (2006.01)
  *H02J 50/00* (2016.01)

(56) References Cited

U.S. PATENT DOCUMENTS

| | | | | |
|---|---|---|---|---|
| 11,047,888 | B1* | 6/2021 | Kowalik | H02J 13/00002 |
| 11,342,956 | B2* | 5/2022 | Campbell | G01V 11/002 |
| 2008/0077336 | A1* | 3/2008 | Fernandes | H02J 13/00006 702/65 |
| 2012/0323396 | A1* | 12/2012 | Shelton | H02M 7/44 700/297 |
| 2014/0203817 | A1* | 7/2014 | Roberson | H02J 13/00002 324/539 |
| 2016/0025782 | A1* | 1/2016 | Bogdanovich | C07C 217/80 702/62 |
| 2016/0224083 | A1* | 8/2016 | Dent | G06F 13/4282 |
| 2018/0020413 | A1* | 1/2018 | Kim | H04W 52/225 |
| 2020/0212709 | A1* | 7/2020 | de Callafon | H02J 3/0012 |
| 2021/0088561 | A1* | 3/2021 | Mobley | G01R 19/0092 |

OTHER PUBLICATIONS

Monolithic Power Systems. mEZD41502A-A. [Online]. Available: https://www.monolithicpower.com/en/mezd41502a-a.html. 2021.
Mornsun Power. URB_YMD-6WR3. [Online]. Available: https://www.mornsun-power.com/html/products-detail/URB_YMD-6WR3.html. 2022.
MQTT. MQTT: The standard for IoT messaging. [Online]. Available: https://mqtt.org/. 2020.
P. Chatterjee, A. Pal, J. S. Thorp, J. De La Ree, and V. A. Centeno, "Error reduction of phasor measurement unit (PMU) data considering practical constraints," IET Gener., Transm. Distrib., vol. 12, No. 10, pp. 2332-2339, May 2018.
P. Gupta, A. Pal, and V. Vittal, "Coordinated wide-area control of multiple controllers in a power system embedded with HVDC lines," IEEE Trans. Power Syst., vol. 36, No. 1, pp. 648-658, Jan. 2021.
P. Mansani, A. Pal, M. Rhodes, and B. Keel, "Estimation of transmission line sequence impedances using real PMU data," in Proc. IEEE North American Power Symposium (NAPS), Fargo, ND, pp. 1-6, Sep. 9-11, 2018.
Padarsey DC 24V 15A 360W Power Supply Universal Regulated Switching Transformer Adapter. [Online]. Available: https://www.amazon.com/Padarsey-Universal-Regulated-Switching-Transformer/dp/B07CPTHG7N. 2018.
Phoenix metropolitan area. [Online]. Available: https://en.wikipedia.org/wiki/Phoenix_metropolitan_area. 2021.
PLECS: The simulation platform for power electronics systems. User manual version 4.5. [Online]. Available: www.plexim.com/files/plecsmanual.pdf. 2020.
R. S. Biswas, and A. Pal, "A robust techno-economic analysis of PMU-based islanding detection schemes," in Proc. IEEE Texas Power Energy Conf. (TPEC), College Station, TX, pp. 1-6, Feb. 9-10, 2017.
R. S. Biswas, B. Azimian, and A. Pal, "A micro-PMU placement scheme for distribution systems considering practical constraints," in Proc. IEEE Power Eng. Soc. General Meeting, Montreal, Canada, pp. 1-5, Aug. 2-6, 2020.
Reason RPV311. [Online]. Available: https://www.gegridsolutions.com/measurement_recording_timesync/catalog/rpv311.htm. 2021.
S. Almasabi and J. Mitra. "Multistage optimal PMU placement considering substation infrastructure," IEEE Trans. on Ind. Apps., vol. 54, No. 6, pp. 6519-6528, Nov. 2018.
Siglent. SDS1052DL+. [Online]. Available: https://siglentna.com/product/sds1052dl-2/. 2021.
T. Blalack, D. Ellis, M. Long, C. Brown, R. Kemp and M. Khan, "Low-power distributed sensor network for wildfire detection," SoutheastCon, Huntsville, AL, 2019, pp. 1-3.
T. Overbye and R. Baldick. EE 369: Power System Analysis: Lecture 18. Texas A&M University Engineering. [Online]. Available: http://users.ece.utexas.edu/~baldick/classes/369/Lecture_18.ppt.
T. Wang, A. Pal, J. S. Thorp, and Y. Yang, "Use of polytopic convexity in developing an adaptive inter-area oscillation damping scheme," IEEE Trans. Power Syst., vol. 32, No. 4, pp. 2509-2520, Jul. 2017.
T. Wang, A. Pal, J. S. Thorp, Z. Wang, J. Liu, and Y. Yang, "Multi-polytope based adaptive robust damping control in power systems using Cart," IEEE Trans. Power Syst., vol. 30, No. 4, pp. 2063-2072, Jul. 2015.
T. Wang, C. S. Ruf, B. Block, D. S. McKague and S. Gleason. (Jan. 2019). Design and performance of a GPS constellation power monitor system for improved CYGNSS L1B calibration, IEEE J. Selected Topics in Applied Earth Observations and Remote Sensing, vol. 12, No. 1, pp. 26-36.
Techturorialsx.com. ESP32 Arduino: Encryption using AES-128 in ECB mode. [Online]. Available: https://techtutorialsx.com/2018/04/18/esp32-arduino-encryption-using-aes-128-in-ecb-mode/.
TP-Link. TL-WR940N V6. [Online]. Available: https://www.tp-link.com/us/home-networking/wifi-router/tl-wr940n/. 2021.
TP4056: 1A standalone linear Li-ion battery charger with thermal regulation in SOP-8. [Online]. Available: https://dlnmh9ip6v2uc.cloudfront.net/datasheets/Prototyping/TP4056.pdf.
Transformer explodes into fireball at SRP substation in Avondale (AZFamily) [Online]. Available: http://www.azfamily.com/story/32111291/transformer-explodes-into-fireball-at-srp-substation-in-avondale. 2016.
U-Blox. NEO-6 u-blox 6 GPS modules data sheet. [Online]. Available: https://www.u-blox.com/sites/default/files/products/documents/NEO-6_DataSheet_%28GPS.G6-HW-09005%29.pdf.
V. Chakati, M. Pore, A. Banerjee, A. Pal, and S. K. S. Gupta, "Impact of false data detection on cloud hosted linear state estimator performance," in Proc. IEEE Power Eng. Soc. General Meeting, Portland, OR, pp. 1-5, Aug. 5-10, 2018.
Vishay Siliconix. IRLZ34, SiHLZ34. [Online]. Available: https://media.digikey.com/pdf/Data%20Sheets/Vishay%20Siliconix%20PDFs/IRLZ34,SiHLZ34.pdf 2021.
W. Zhang, Y. Jing and X. Xiao. "Model-based general arcing fault detection in medium-voltage distribution lines," IEEE Trans. Power Del., vol. 31, No. 5, pp. 2231-2241, Oct. 2016.
w3schools.com. HTTP Request Methods. [Online]. Available: https://www.w3schools.com/tags/ref_httpmethods.asp 2021.
Wi-Fi protects access. [Online]. Available: https://en.wikipedia.org/wiki/Wi-Fi_Protected_Access. 2003.
X. Jiang, H. Shokri-Ghadikolaei, G. Fodor, E. Modiano, Z. Pang, M. Zorzi, and C. Fischione, "Low-latency networking: Where latency lurks and how to tame it," in Proc. of the IEEE, vol. 107, No. 2, pp. 280-306, Feb. 2019.
X. Wang, Y. Liu, and L. Tong. "Adaptive subband compression for streaming of continuous point-on-wave and PMU data". [Online]. Available: https://arxiv.org/abs/2008.10092.
X. Zhu, M. H. F. Wen, V. O. K. Li and K. Leung. "Optimal PMU-communication link placement for smart grid wide-area measurement systems," IEEE Trans. Smart Grid, vol. 10, No. 4, pp. 4446-4456, Jul. 2019.
Y. Chen and Y. Zou, "Characteristics of GPS ionospheric scintillations over Sanya and Guilin," in 12th Int. Symp. on Antennas, Propagation and EM Theory (ISAPE), Hangzhou, China, 2018, pp. 1-4.
Y. Goda, M. Iwata, K. Ikeda and S. Tanaka. "Arc voltage characteristics of high current fault arcs in long gaps," IEEE Trans. on Power Del., vol. 15, No. 2, pp. 791-795, Apr. 2000.
2020 California wildfires. [Online]. Available: https://en.wikipedia.org/wiki/2020_California_wildfires.
A. Arif, Z. Wang, J. Wang and C. Chen. "Power distribution system outage management with co-optimization of repairs, reconfiguration, and DG dispatch," IEEE Trans. Smart Grid, vol. 9, No. 5, pp. 4109-4118, Sep. 2018.

(56) References Cited

OTHER PUBLICATIONS

A. F. Bastos, K. Lao, G. Todeschini and S. Santoso, "Novel moving average filter for detecting RMS voltage step changes in triggerless PQ data," IEEE Trans. Power Del., vol. 33, No. 6, pp. 2920-2929, Dec. 2018.
A. Pal, A. K. S. Vullikanti, and S. S. Ravi, "A PMU placement scheme considering realistic costs and modern trends in relaying," IEEE Trans. Power Syst., vol. 32, No. 1, pp. 552-561, Jan. 2017.
A. Pal, C. Mishra, A. K. S. Vullikanti, and S. S. Ravi, "General optimal substation coverage algorithm for phasor measurement unit placement in practical systems," IET Gener., Transm. Distrib., vol. 11, No. 2, pp. 347-353, Jan. 2017.
A. Pal, J. S. Thorp, S. S. Veda, and V. A. Centeno, "Applying a robust control technique to damp low frequency oscillations in the WECC," Int. J. Elect. Power Energy Syst., vol. 44, No. 1, pp. 638-645, Jan. 2013.
A. Pal, P. Chatterjee, J. S. Thorp, and V. A. Centeno, "On-line calibration of voltage transformers using synchrophasor measurements," IEEE Trans. Power Del., vol. 31, No. 1, pp. 370-380, Feb. 2016.
A. Silverstein, "High-resolution, time-synchronized grid monitoring devices," in North American Synchrophasor Initiative (NASPI). Rep. PNNL-29770, 2020. [Online]. Available: https://www.naspi.org/sites/default/files/reference_documents/pnnl_29770_naspi_hires_synch_grid_devices_20200320.pdf.
A. Silverstein, "Point on Wave data: what and why," in NASPI Work Group Meeting, San Diego, CA, 2019. [Online]. Available: https://www.naspi.org/sites/default/files/2019-10/02_PointOnWave_POW_Silverstein_20191029.pdf.
Adam Munich. Microwave Transformers. [Online]. Available: https://adammunich.com/microwave-transformers/. 2021.
Analog Devices. LTC3331. [Online]. Available: https://www.analog.com/en/products/ltc3331.html#product-overview. 2021.
Arduino cryptography library. [Online]. Available: https://rweather.github.io/arduinolibs/CryptoLW_8h_source.html. 2018.
Arduino Library List. AESLib. [Online]. Available: https://www.arduinolibraries.info/libraries/aes-lib. 2021.
Autodesk. Eagle. [Online]. Available: http://eagle.autodesk.com/. 2018.
Battery University. BU-409: charging lithium-ion. [Online]. Available: https://batteryuniversity.com/learn/article/charging_lithium_ion_batteries. 2021.
C. Mishra, A. Pal, and V. A. Centeno, "Kalman-filter based recursive regression for three-phase line parameter estimation using phasor measurements," in Proc. IEEE Power Eng. Soc. General Meeting, Denver, CO, pp. 1-5, Jul. 26-30, 2015.
C. Mishra, K. D. Jones, A. Pal, and V. A. Centeno, "Binary particle swarm optimisation-based optimal substation coverage algorithm for phasor measurement unit installations in practical systems," IET Gener. Transm. Distrib., vol. 10, No. 2, pp. 555-562, Feb. 2016.
D. M. Said, K. M. Nor and M. S. Majid, "Analysis of distribution transformer losses and life expectancy using measured harmonic data," in Proc. of 14th Int. Conf. on Harmonics and Quality of Power—ICHQP, Bergamo, Italy, 2010, pp. 1-6.
D. Macii, D. Petri and A. Zorat. "Accuracy analysis and enhancement of DFT-based synchrophasor estimators in off-nominal conditions," IEEE Trans. on Instrum. Meas., vol. 61, No. 10, pp. 2653-2664, Oct. 2012.
DROK. 5v Regulator, DROK Mini Voltage Reducer. [Online]. Available: https://www.amazon.com/gp/product/B0758ZTS61 2017.
ElectronicsTutorials.ws. Capacitive reactance. [Online]. Available: https://www.electronics-tutorials.ws/filter/filter_1.html. 2021.
ElectronicsTutorials.ws. Passive Low Pass Filter. [Online]. Available: https://www.electronics-tutorials.ws/filter/filter_2.html. 2021.
Espressif Systems. ESP32 Technical Reference Manual. [Online]. Available: https://www.espressif.com/sites/default/files/documentation/esp32_technical_reference_manual_en.pdf. 2024.
Fluke Calibration. 6105A, 6100B Electrical Power Quality Calibrator. [Online]. Available: https://us.flukecal.com/products/electrical-calibration/electrical-calibrators/6105a-6100b-electrical-power-quality-calibrat?quicktabs_product_details=0. 2021.
Fluke Calibration. 6135A/PMUCAL Phasor Measurement Unit Calibration System. [Online]. Available: https://us.flukecal.com/products/electrical-calibration/electrical-calibrators/6135apmucal-phasor-measurement-unit-calibration 2021.
Galco Current Transformers. 7ASHT-801. [Online]. Available: https://www.galco.com/buy/Instrument-Transformer-Div-of-GE/7ASHT-801. 2023.
GE Grid Solutions, "L90 line current differential system," 2018. [Online]. Available: https://www.gegridsolutions.com/app/DownloadFile.aspx?prod=I90&type=3& file=9.
GE Grid Solutions. Configure your RA331 Acquisition Module for RPV311. [Online]. Available: https://store.gegridsolutions.com/ViewProduct.aspx?Model=RA331 2018.
H. Lala and S. Karmakar. "Detection and experimental validation of high impedance arc fault in distribution system using empirical mode decomposition," IEEE Syst. J., vol. 14, No. 3, pp. 3494-3505, Sep. 2020.
HW-Group. Hercules Setup utility. [Online]. Available: https://www.hw-group.com/software/hercules-setup-utility. 2021.
I. Niazazari and H. Livani, "Disruptive event classification using PMU data in distribution networks," in IEEE Power & Energy Society General Meeting, Chicago, IL, USA, 2017, pp. 1-5.
IEEE guide for grounding of instrument transformer secondary circuits and cases, IEEE Std. C57.13.3-2014 (Revision of IEEE Std. C57.13.3-2005), Jan. 2015.
IEEE Recommended practice for the design of DC power systems for stationary applications, IEEE Std. 946-2020 (Revision of IEEE Std. 946-2004), Sep. 2020.
IEEE Standard for Synchrophasor Data Transfer for Power Systems, IEEE Std. C37.118.2-2011 (Revision of IEEE Std C37.118-2005), Dec. 2011.
interfacebus.com. Chart of AWG sizes in metric. [Online]. Available: http://www.interfacebus.com/table-of-awg-wire-gauge-standards-metric.html. 1998.
J. Ahmad, A. S. Malik and L. Xia, "Vegetation monitoring for high-voltage transmission line corridors using satellite stereo images," in National Postgraduate Conf., Perak, Malaysia, 2011, pp. 1-5.
J. Liu, Y. Zhou, Y. Li, G. Lin, W. Zu, Y. Cao, X. Qiao, C. Bo-Sun, Y. Cao, and C. Rehtanz. (Jul. 2020). Modelling and analysis of radial distribution network with high penetration of renewable energy considering the time series characteristics, IET Generation, Transmission & Distribution, vol. 14, No. 14, pp. 2800-2809.
J. Patterson and A. Pal, "An inductively powered line-mounted time-synchronized micro point-on-wave recorder," in Proc. IEEE Power Eng. Soc. General Meeting, Washington D.C., USA, Jul. 2021., to be published.
JLCPCB. China's Largest PCB Prototype Manufacturer. [Online]. Available: https://jlcpcb.com/. 2021.
K. Chauhan and R. Sodhi. "Placement of distribution-level phasor measurements for topological observability and monitoring of active distribution networks", IEEE Trans. Instrum. Meas., vol. 69, No. 6, pp. 3451-3460, Jun. 2020.
K. Vijitha, M. P. Selvan and P. Raja, "Short circuit analysis and adaptive zonal protection of distribution system with distributed generators," in Int. Conf. on Energy, Power and Environment: Towards Sustainable Growth (ICEPE), Shillong, India, 2015, pp. 1-6.
L. A. Wong, V. K. Ramachandaramurthy, S. L. Walker and J. B. Ekanayake. "Optimal Placement and Sizing of Battery Energy Storage System Considering the Duck Curve Phenomenon," IEEE Access, vol. 8, pp. 197236-197248, 2020.
Learn about Public Safety Power Shutoff (PSPS) events. [Online]. Available: https://www.pge.com/en_US/residential/outages/public-safety-power-shutoff/learn-about-psps.page. 2021.
LeMotech ABS Plastic Junction Box. [Online]. Available: https://www.amazon.com/LeMotech-Junction-Dustproof-Waterproof-Electrical/dp/B07BPQH98D. 2018.
M. Barkakati, R. S. Biswas, and A. Pal, "A PMU based islanding detection scheme immune to additive instrumentation channel errors," in Proc. IEEE North American Power Symposium (NAPS), Wichita, KS, pp. 1-6, Oct. 13-15, 2019.

(56) References Cited

OTHER PUBLICATIONS

M. Dong and A. B. Nassif, "Degradation simulation for non-destructive conditions of power system equipment," in IEEE Elect. Power and Energy Conf. (EPEC), Edmonton, Canada, 2020, pp. 1-4.

M. Ghamsari-Yazdel, M. Esmaili, F. Aminifar, P. Gupta, A. Pal, and H. A. Shayanfar, "Incorporation of controlled islanding scenarios and complex substations in optimal WAMS design," IEEE Trans. Power Syst., vol. 34, No. 5, pp. 3408-3416, Sep. 2019.

M. S. Munir, Y. W. Li and H. Tian. "Residential distribution system harmonic compensation using priority driven droop controller," in CPSS Trans. Power Elect. and Applicat., vol. 5, No. 3, pp. 213-223, Sep. 2020.

MathWorks. rms. [Online]. Available: https://www.mathworks.com/help/signal/ref/rms.html. 2021.

MathWorks. thd. [Online]. Available: https://www.mathworks.com/help/signal/ref/thd.html. 2021.

\* cited by examiner

TIME-SYNCHRONIZED MICRO-CPoW MEASUREMENT DEVICE

CROSS-REFERENCE TO RELATED APPLICATIONS

This application claims priority to U.S. provisional application No. 63/243,864 filed on Sep. 14, 2021, incorporated herein by reference in its entirety.

STATEMENT REGARDING FEDERALLY SPONSORED RESEARCH OR DEVELOPMENT

This invention was made with government support under 1934766 awarded by the National Science Foundation. The government has certain rights in the invention.

FIELD OF THE DISCLOSURE

The present disclosure is related to systems and devices for measuring current flowing through power distribution conductors.

BACKGROUND OF THE INVENTION

The reliable and economical delivery of electric power to businesses, homes, and critical facilities is at the forefront of every electric power utility's priorities. Ensuring that electric power is indeed delivered reliably and economically to customers requires a deep understanding of the structure, behavior, and health of every level of the power system. Power utilities have relied on monitoring systems such as the supervisory control and data acquisition (SCADA) system for decades to monitor their systems.

In the last few years, utilities have started using phasor measurement units (PMUs) to obtain time-synchronized measurements of the voltage and current magnitudes and phase angles, frequency, and rate-of-change-of-frequency (RoCoF) throughout their systems. These values have enabled near-complete observability of many transmission-level power systems, detection of islanding (separation of portions of the power system into separate asynchronous regions), and online calibration of instrument transformers. Further research has indicated that these values may also be used for estimating transmission line impedances and even in actively damping inter-area oscillations, which can be catastrophic if unchecked.

Despite the many advantages imparted by PMUs to their respective power systems, there are relatively few PMUs installed within the distribution system currently due to their high cost. In part, the high cost of these devices results from the need for robust electrical isolation between medium-voltage electric lines and the measurement hardware, which is typically ground-referenced and coupled through instrument transformers. Sourcing on-site power for these devices is also costly due to the need for suitable low-voltage electrical sources for the operation of the measurement hardware. Finally, the use of dedicated communication infrastructure to relay measurements back to the control center incurs additional cost to the operation of measurement devices throughout the distribution system.

As the modern power system has grown increasingly complex, serious events such as wildfires, catastrophic asset failures, and power outages have become increasingly common, including within the distribution system. As such, now is the time for power utilities to rethink how they monitor their systems, particularly at the distribution level.

SUMMARY OF THE INVENTION

Some embodiments of the invention disclosed herein are set forth below, and any combination of these embodiments (or portions thereof) may be made to define another embodiment.

A time-synchronized micro-scale continuous point-on-wave (CPoW) measurement device, referred to as micro-CPoW, is provided. The distribution system is an integral part of the electric power system, but not much is known about how it behaves in real-time. To address this knowledge gap, a low-cost, time-synchronized, CPoW measurement system is designed, built, and characterized herein. This inductively powered micro-CPoW measurement device, which operates wirelessly by using the current flowing through a typical distribution conductor as its power source and a wireless data link for communication, has been configured to measure instantaneous line current at high frequency (nominally 3,000 samples per second) with 12-bit resolution (although other resolutions and sample rates may be used).

The purpose of the micro-CPoW measurement devices and systems as described herein is to monitor the instantaneous electric current flowing through a distribution line conductor in real time. Detection of harmonics, identification of incipient fault conditions, and general power quality monitoring are typical uses for the measured information. Because the micro-CPoW measurement device is self-powered by the line current and communicates wirelessly, it can be installed without the need for ground-mounted instrument transformers, low-voltage power sources, or communications cabling. Thus, this particular design of CPoW module is intended to be installed directly on or proximate to a power line without the need for external support equipment.

Those skilled in the art will appreciate the scope of the present disclosure and realize additional aspects thereof after reading the following detailed description of the preferred embodiments in association with the accompanying drawing figures.

In one aspect, an exemplary embodiment provides a micro-CPoW measurement device. The micro-CPoW measurement device includes an inductive energy harvesting circuit configured to power the micro-CPoW measurement device from a power line; a CPoW measurement circuit configured to generate line current measurements from the power line; a wireless transmitter; and a processor in communication with the CPoW measurement circuit and the wireless transmitter and configured to cause the wireless transmitter to transmit the line current measurements to a network device.

In one embodiment, the device further comprises a first current transformer coupled to the inductive energy harvesting circuit.

In one embodiment, the device further comprises a second current transformer coupled to the CPoW measurement circuit.

In one embodiment, the device further comprises a global positioning system (GPS) receiver.

In one embodiment, the device is arc flash resistant.

In one embodiment, the device further comprises a battery.

In one embodiment, the device comprises a printed circuit board (PCB).

In one embodiment, the device is time-synchronized.

In one embodiment, the device is configured to measure line current at a frequency of at least 1,000 samples per second.

In one embodiment, the device is configured to measure line current at an 8 bit or greater resolution In one embodiment, the device is configured to measure in real time instantaneous electric current flowing through a distribution line conductor, incipient fault conditions, power quality, millisecond-scale transient events, higher-order harmonic content, sudden phase-step events, or transient events.

In one embodiment, the device is configured to be mounted onto or proximate a power line.

In one embodiment, the device is configured to operate free from ground or any other voltage reference.

In one embodiment, the device further comprises accessible analog-to-digital converter (ADC) inputs and digital contact inputs.

In one embodiment, the device is enclosed in a weather-resistant package.

In another aspect, another exemplary embodiment provides a micro-continuous point-on-wave (CPoW) measurement system. The micro-CPoW system includes the micro-CPoW measurement device as described above, wherein the device is configured to inductively power the continuous point-on-wave (CPoW) measurement circuit using the line current, generate line current measurements by causing the CPoW measurement circuit to inductively measure the line current, and wirelessly transmit the line current measurements; and a computing system communicatively connected to the micro-CPoW measurement device, comprising a processor and a non-transitory computer-readable medium with instructions stored thereon, which when executed by a processor, perform steps comprising: wirelessly receiving line current measurements from the micro-CPoW measurement device; and displaying the line current measurements.

In another aspect, another exemplary embodiment provides a method for measuring line current in an electric power system. The method includes inductively powering a CPoW measurement circuit using the line current; generating line current measurements by causing the CPoW measurement circuit to inductively measure the line current; and wirelessly transmitting the line current measurements.

In one embodiment, the method further comprises time stamping the line current measurements based on an external time source.

In one embodiment, time indicators from the external time source are received from a global positioning system (GPS) receiver In one embodiment, the method further comprises wirelessly transmitting a position received from the GPS receiver.

BRIEF DESCRIPTION OF THE DRAWINGS

The accompanying drawing figures incorporated in and forming a part of this specification illustrate several aspects of the disclosure, and together with the description serve to explain the principles of the disclosure.

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION OF THE INVENTION

Figure 1:
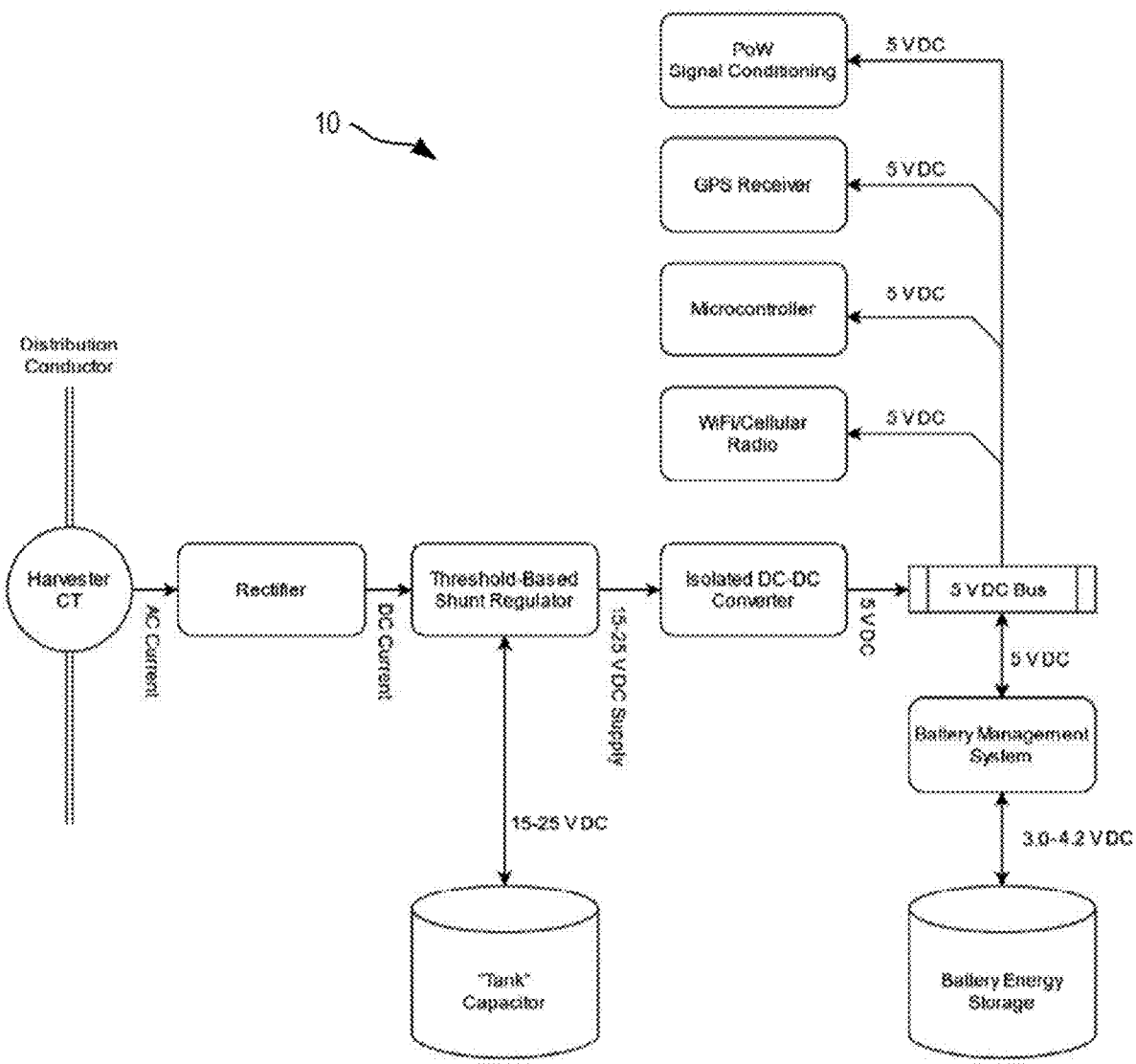
FIG. 1 is a schematic block diagram of function blocks and power sources within a micro-continuous point-on-wave (CPoW) measurement device according to embodiments described herein.

It is to be understood that the figures and descriptions of the present invention have been simplified to illustrate elements that are relevant for a clearer comprehension of the present invention, while eliminating, for the purpose of clarity, many other elements found in systems and methods of micro-continuous point-on-wave (CPoW) measurement. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Referring now in detail to the drawings, in which like reference numerals indicate like parts or elements throughout the several views, in various embodiments, presented herein are CPoW measurement devices, systems and methods.

A time-synchronized micro-scale continuous point-on-wave (CPoW) measurement device, referred to as micro-CPoW, is provided. The distribution system is an integral part of the electric power system, but not much is known about how it behaves in real-time. To address this knowledge gap, a low-cost, time-synchronized, CPoW measurement system is designed, built, and characterized herein. This inductively powered micro-CPoW measurement device, which operates wirelessly by using the current flowing through a typical distribution conductor as its power source and a wireless data link for communication, has been configured to measure instantaneous line current at high frequency (nominally 3,000 samples per second) with 12-bit resolution (although other resolutions and sample rates may be used).

The purpose of the micro-CPoW measurement devices and systems as described herein is to monitor the instantaneous electric current flowing through a distribution line conductor in real time. Detection of harmonics, identification of incipient fault conditions, and general power quality monitoring are typical uses for the measured information. Because the micro-CPoW measurement device is self-powered by the line current and communicates wirelessly, it can be installed without the need for ground-mounted instrument transformers, low-voltage power sources, or communications cabling. Thus, this particular design of CPoW module is intended to be installed directly on a power line without the need for external support equipment.

Despite the wealth of information that phasor measurement units (PMUs) provide to utilities, there are several key measurements that PMUs are unable to provide. In particular, millisecond-scale transient events, higher-order harmonic content, and sudden phase-step events may be incorrectly measured or even missed entirely by existing synchrophasor equipment. In order to accurately observe these very fast events, it is necessary to leverage an even more granular measurement technology, namely, CPoW. CPoW technology captures instantaneous measurements of voltage and/or current, typically at hundreds or, in the case of newly developed devices, even thousands of samples per second, and as a result provides a point-by-point image of the desired waveform (rather than a phasor approximation).

CPoW devices are capable of detecting transients, harmonic content, and sudden phase changes at frequencies as high as their Nyquist frequency, and are therefore extremely well-suited for capturing fast events. Event-triggered point-on-wave (PoW) technology has already proven to be a highly successful post-mortem analysis tool for power utilities, and has been widely leveraged in digital fault recorders (DFRs) to capture the point-by-point voltages and currents of critical assets just before and just after they fail. Despite the successful use of PoW measurement technology in DFRs, such event-triggered measurement devices capture only the events that are severe enough to trigger the device to save recorded data. Hence, they do not effectively capture subtler but potentially equally pernicious fault events such as vegetation strikes, gradual intermittent asset degradation, or persistent harmonics induced by distributed renewable energy inverters and power electronics loads. To effectively monitor these phenomena, PoW measurements must be taken continuously and processed in real-time.

Commercial CPoW, micro-PMU, and DFR devices do exist; however, as with most PMUs and other measurement devices available, such devices typically require substantial support infrastructure, including large ground-mounted instrument transformers, on-site low-voltage power supplies, and hard-wired communication links. As such, these units can only be feasibly installed at a limited number of measurement locations.

Embodiments described herein provide a new type of CPoW device (the micro-CPoW measurement device) developed with the goal to improve or eliminate the challenges that have previously impeded the progress of deploying CPoW technology on a massive scale. In particular, developments incorporated into these embodiments include the ability for the system to self-power from the current flowing through a distribution conductor via inductive energy harvesting and a self-contained design capable of being mounted directly on or proximate to an electric power line. The need for dedicated communication infrastructure is eliminated fully or in part by leveraging mature and robust wireless communication networks, including the cellular network and 5th-generation (5G) technologies. Because the system leverages commodity-scale electronics, it is economical to produce, and is well-suited for extensive deployment throughout electric power systems.

CPoW Module Design

FIG. 1 is a schematic block diagram of function blocks and power sources within a micro-CPoW measurement device 10 according to embodiments described herein. The micro-CPoW measurement device 10 is a self-powered, fully wireless, fully self-contained CPoW line current measurement system with time-synchronization capabilities. The block diagram of FIG. 1 depicts exemplary functional blocks of the system and their internal power sources.

The micro-CPoW measurement device 10 described herein is a time-synchronized micro-scale CPoW module. The system measures electric power line current, time-synchronizes this data, and transmits it wirelessly to an off-site location (e.g., a network device) for subsequent data processing. The module is designed to be completely standalone and can be mounted directly onto or proximate to an electric power line for field deployment. The purpose of the micro-CPoW measurement device 10 is to monitor the instantaneous electric current flowing through a distribution line conductor in real time. Detection of harmonics, identification of incipient fault conditions, and general power quality monitoring are typical uses for the measured information.

Figure 2:
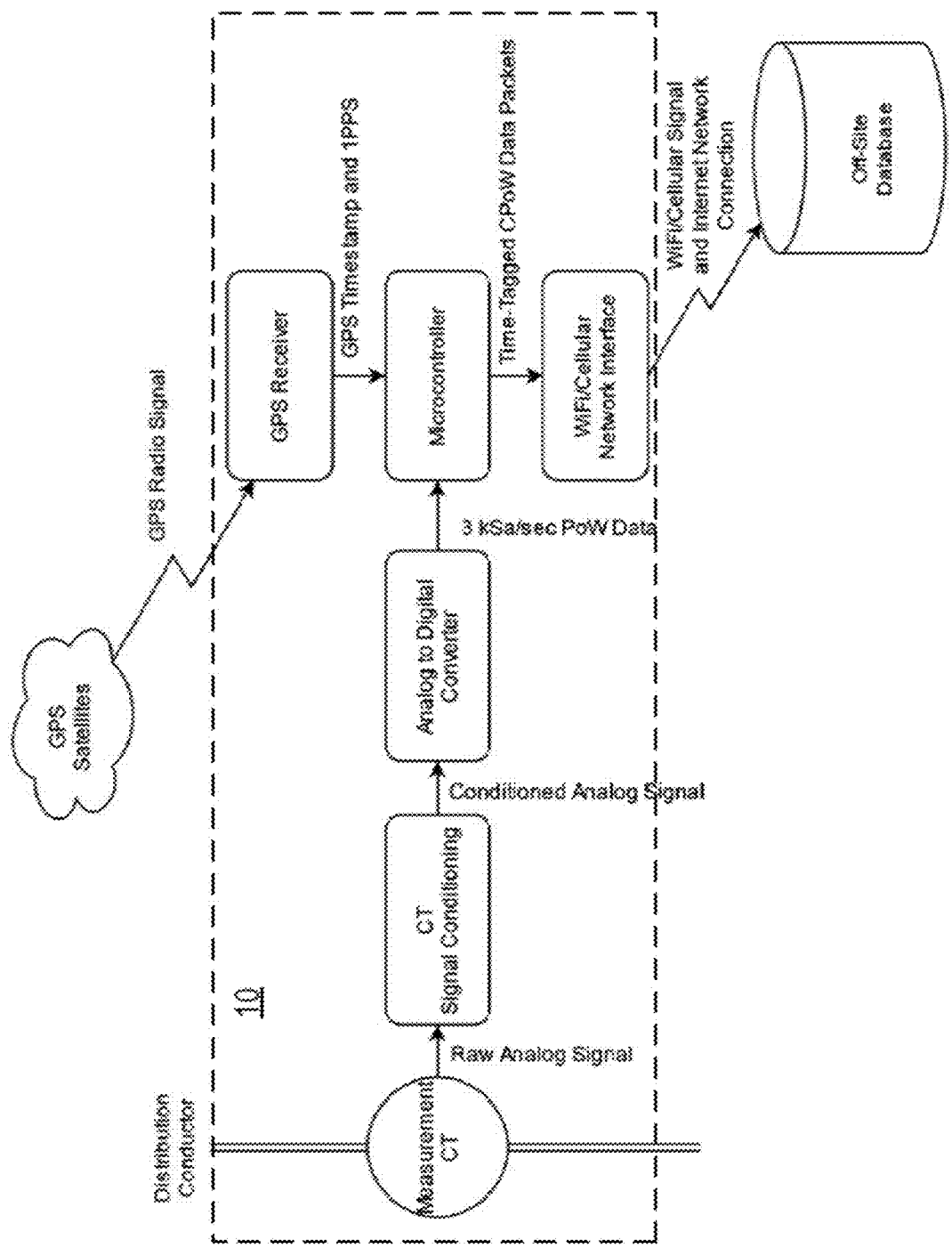
FIG. 2 is a schematic block diagram of the micro-CPoW measurement device of FIG. 1 and external infrastructure.

FIG. 2 is a schematic block diagram of the micro-CPoW measurement device 10 of FIG. 1 and external infrastructure. This figure shows the communication paths within and external to the micro-CPoW measurement device 10.

With continuing reference to FIGS. 1 and 2, and in light of the identified challenges to widespread CPoW installation, the following capabilities, alone or in combination, are recommended for embodiments described herein. The inclusion of a compact onboard current measurement transformer capable of operating in a galvanically isolated configuration without the need to be connected to earth ground or any other voltage reference; The capability of the system to harvest energy directly from an electric power distribution conductor and remain continuously powered under typical loading conditions; The capability of the system to continuously transmit acquired data to a wireless base station or cellular link; A self-contained weather-resistant package enabling the system to be directly installed on or proximate to an electric power conductor, without the need for a dedicated cabinet or switchyard pad.

In order to improve upon the deficiencies in many other CPoW systems currently available, the following added features, alone or in combination, can be included in embodiments of the micro-CPoW measurement device 10 described herein: A compact global positioning system (GPS) receiver module capable of reliable GPS signal reception even in partially shaded conditions; An onboard battery with appropriate battery charging and output voltage regulation equipment capable of operating the micro-CPoW measurement device 10 during low line current conditions or fault events; Accessible analog-to-digital converter (ADC) inputs and digital contact inputs for ease of integration of additional sensors.

EXPERIMENTAL EXAMPLES

The invention is now described with reference to the following Examples. These Examples are provided for the purpose of illustration only and the invention should in no way be construed as being limited to these Examples, but rather should be construed to encompass any and all variations which become evident as a result of the teaching provided herein.

Without further description, it is believed that one of ordinary skill in the art can, using the preceding description and the following illustrative examples, make and utilize the present invention and practice the claimed methods. The following working examples therefore, specifically point out exemplary embodiments of the present invention, and are not to be construed as limiting in any way the remainder of the disclosure.

To validate the performance of the micro-CPoW measurement device, tests of measurement accuracy, electric current requirements, and susceptibility to electromagnetic interference from both steady-state and arc-induced sources were performed. The results indicate that the proposed recorder satisfies both the technical as well as the economical constraints required for bulk deployment in an actual distribution network.

Table 1 includes a list of some commodity-scale electronics components that have been utilized in embodiments of the micro-CPoW measurement device 10 used for evaluation.

TABLE 1

Selected commodity-scale components for evaluated embodiments of the micro-CPoW measurement device

| Component | Function |
| --- | --- |
| ESP32-DevKitC-32D | Data processing, ADC, Wireless Communication |
| NEO-6M | GPS Receiver |
| ATTiny85 | Voltage Control |
| IRLZ34PBF | Current Shunt Element |
| DROK 2001708006 | Voltage Regulation |
| UB5C-0R2F1 | Burden Resistance |
| Circuit Board and Support Components | Component Support and Operation |
| Lm201803261105 | Plastic Enclosure |
| 7ASHT-801 (2 Units) | CT |

In order to enable the GPS synchronization system to provide the high-accuracy timestamping to the CPoW data, a serial link or other electronic interface enables the GPS receiver to communicate the current Coordinated Universal Time (UTC) timestamp to a central microcontroller for time-tagging of data. This link may also provide the ability for the microcontroller to extract information such as GPS timestamp, latitude and longitude information, altitude, and the number of satellites visible to the GPS receiver. A 1 pulse-per-second (1PPS) signal is also furnished to the microcontroller by the GPS receiver, enabling nanosecond-precision time synchronization to be performed.

Wireless communication in the micro-CPoW measurement device 10 may be performed over IEEE 802.11N Wi-Fi communication, via 4th generation (4G) or 5G cellular communication, Bluetooth communication, or over any other wireless communication channel deemed appropriate by the use case. A wireless interface card can be included in the micro-CPoW measurement device 10 in order to facilitate this functionality. The wireless connection may then be utilized to send transmission control protocol (TCP). Encrypting the wirelessly transmitted data is also recommended in order to provide a layer of security against spoofing attacks and false data injection (FDI). Request packets or other data packets containing the following information can be sent to a backend server: CPoW measurements collected from one or more of the ESP32 microcontroller's onboard 12-bit ADCs; Status of the 1PPS pin for every CPoW measurement captured to time-align each CPoW measurement with its exact measurement time; GPS time and date code to allow the 1PPS-synchronized measurements to be correlated to a particular timestamp; GPS satellite count, as an indicator of the quality of the timing signal provided by the GPS module.

In order to accurately transduce electric current signals into a voltage signal that can be readily polled by an analog-to-digital converter (ADC), embodiments can use a current transformer (CT). A precision shunt resistor can be connected to the secondary terminals of the CT in order to provide a voltage signal to the ADC in use with the circuit. Optional analog filtering can be applied to this voltage signal in order to remove spurious electrical noise, and such signal may then be measured by the ADC. The use of a microcontroller with an onboard ADC enables direct connection of the processed analog signal to the microcontroller for sampling, storage, and transmission via the wireless communication link.

A second CT is employed to harvest energy from the electric current flowing through the power line. A switched-mode shunt regulator is implemented, with the control objective to maintain a tank capacitor voltage window between two set values. This tank voltage is then available for use by subsequent post-regulation stages to derive the 5 V and 3.3 V supply voltages required by the other blocks within the micro-CPoW measurement device 10. This control has been implemented using a threshold-based hysteresis control strategy as such a mode of control works well with the inherently fixed-current nature of the output supply from the CT.

A battery management system and external battery may also be included in order to enable the micro-CPoW measurement device 10 to operate even when insufficient current is flowing through the power line to operate the CPoW module continuously. When adequate power is available from the energy harvesting circuit to supply the micro-CPoW measurement device 10, a 5V supply is provided from the voltage regulation circuitry associated with the energy harvesting circuit. In the case where there is not sufficient power from the energy harvesting circuit to support the micro-CPoW measurement device 10, the voltage output of the energy-harvesting circuit drops, resulting in power instead being drawn from a boost converter module which provides a stable output voltage from the battery voltage supply. A typical battery type and configuration is a 1-cell 4000-mAh lithium polymer cell; however, other combinations of battery chemistry and configuration may be employed.

Finally, an external enclosure is required in order to physically contain the PCB, battery, GPS antenna, and wiring for the CTs, keep these components dry, and additionally provide structural mounting for the CTs. The Lm201803261105 water-resistant enclosure was selected for prototyping; however, other off-the-shelf or custom-manufactured enclosures may be used to provide similar weatherproofing performance.

Detailed circuit schematics of several blocks of the system are illustrated in FIGS. 3-7.

Measurement CT Signal Conditioning

Figure 3:
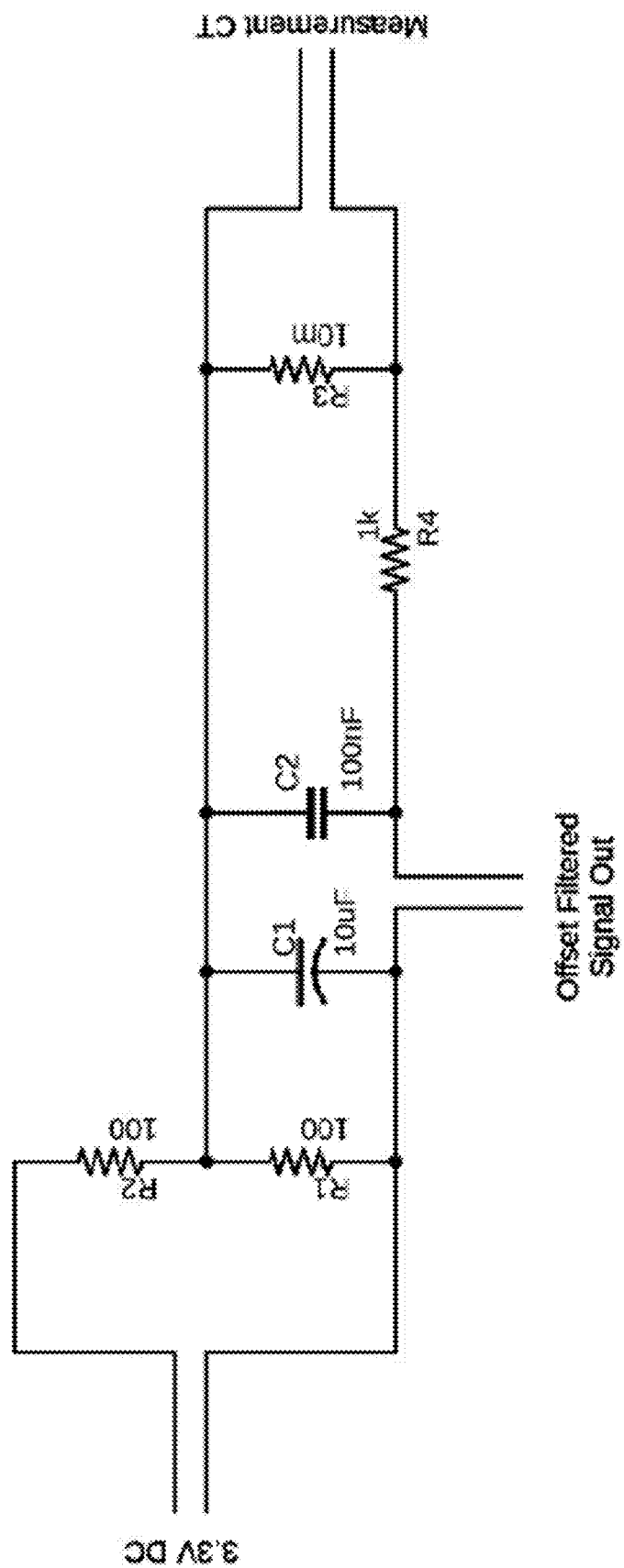
FIG. 3 is a schematic circuit diagram of a current transformer (CT) signal conditioning circuit for the micro-CPoW measurement device of FIG. 1.

FIG. 3 is a schematic circuit diagram of a CT signal conditioning circuit for the micro-CPoW measurement device 10 of FIG. 1. In an exemplary embodiment, the CT employed in both the energy harvesting block as well as the current measurement block of the micro-CPoW measurement device 10 has a current transformation ratio of 800:5 amps (A). This can be equivalently expressed as a turns-ratio, T=160. The maximum current rating of this transformer, and the highest current expected to be measured by this version of the micro-CPoW measurement device 10, is 800 A root-mean square (RMS).

The maximum output current that needs to be sensed by the measurement CT signal conditioning block is computed in Equations 1 and 2.

$$I_{max_{sec}} = \frac{I_{max_{pri}}}{T} \quad \text{Equation 1}$$

$$I_{max_{sec}} = \frac{800 \text{ A}}{160} = 5 \text{ A} \quad \text{Equation 2}$$

where $I_{max_{pri}}$ is the maximum RMS primary CT current, $I_{max_{sec}}$ is the maximum RMS secondary CT current, and T is the CT turns-ratio. The internal ADCs within the ESP32 microcontroller are configured to measure voltage (not current); therefore, the AC current signal supplied by the secondary winding of the CT must be converted to a proportional AC voltage signal. This is achieved by the use of a precision shunt resistor. The value of the shunt resistor is selected in order to ensure that the maximum voltage across the resistor will not exceed the voltage range of the internal ADC of the ESP32. The internal ADCs within the ESP32 microcontroller have an input voltage range (with respect to ground) of 0 V-3.3 V. As such, an upper limit for the resistor value used is found as in Equations 3 and 4.

$$R_{max} = \frac{\left(\frac{V_{ADC}}{2}\right)}{I_{max_{sec}}\sqrt{2}} \quad \text{Equation 3}$$

$$R_{max} = \frac{\left(\frac{3.3 \text{ V}}{2}\right)}{(5 \text{ A})\sqrt{2}} = 0.2333 \, \Omega \quad \text{Equation 4}$$

where $V_{ADC}$ is the voltage supplied to the microcontroller ADC, and $I_{max_{sec}}$ is the maximum RMS secondary CT current.

A 0.2Ω shunt resistor is therefore selected for use in the exemplary design in order to provide a safety margin in the maximum resistor value, as well as due to this value's widespread availability. In order to ensure that both the positive and negative swings of the sinusoidal AC current measured by the CT are read by the ADC, a fixed DC offset must be applied to the AC voltage delivered by the shunt resistor. In order to ensure equal headroom on both the positive and negative signal swings, the necessary DC offset is computed as in Equations 5 and 6.

$$V_{offset} = \frac{V_{ADC}}{2} \qquad \text{Equation 5}$$

$$V_{offset} = \frac{3.3 \text{ V}}{2} = 1.65 \text{ V} \qquad \text{Equation 6}$$

where $V_{ADC}$ is the voltage supplied to the microcontroller ADC, and $V_{offset}$ is the DC voltage offset required for sensing AC signals using the ADC.

The 1.65 V DC offset reference is obtained via a voltage division of the 3.3 V supply voltage utilized by the ESP32 microcontroller. This voltage-divided voltage source is then capacitively coupled to ground to ensure it remains stable at all levels of AC current application to the CT. The voltage excursion of the DC offset source from its nominal value at the line frequency of 60 Hz and a worst-case current of 5 A is computed analytically as in Equations 7 and 8.

$$V_{exc} = V_{measured} * \frac{X_{cap_{offset}}}{R_{lpf} + X_{cap_{lpf}}} = V_{measured} * \frac{2\pi f C_{offset}}{R_{lpf} + \frac{1}{2\pi f C_{lpf}}} \qquad \text{Equation 7}$$

$$V_{exc} = (3.3 \text{ V}) * \frac{2\pi(60 \text{ Hz})(10 \text{ }\mu\text{F})}{(1000 \text{ }\Omega) + \frac{1}{2\pi(60 \text{ Hz})(100 \text{ nF})}} = 4.519 * 10^{-7} \text{ V} \qquad \text{Equation 8}$$

where $V_{measured}$ is the maximum measurement voltage swing applied to the ADC, $X_{cap_{offset}}$ is the reactance of the voltage offset capacitor at the line frequency, $R_{lpf}$ is the signal conditioner low pass filter resistor value, $X_{cap_{lpf}}$ is the reactance of the signal conditioner low pass filter capacitor at the line frequency, f is the line frequency, $C_{offset}$ is the capacitance value of the voltage offset capacitor, $C_{lpf}$ is the capacitance value of the signal conditioner low pass filter capacitor, and $V_{exc}$ is the RMS AC voltage excursion superimposed on the nominal ADC offset voltage.

It can be realized from Equation 8 that the AC voltage excursion of the DC offset capacitor voltage (assuming the component values specified in FIG. 3) is negligibly small.

Finally, prior to its delivery to the ADC within the ESP32, the offset voltage signal is filtered to remove any high-frequency noise that might be imposed on the signal by onboard switching electronics or external sources. Although the fundamental frequency being measured by this embodiment of the micro-CPoW measurement device 10 is designed to be 60 Hz, a much higher filter cutoff frequency is desired in order to capture higher-frequency events and harmonics. A first-order RC filter is designed with a time constant chosen to be at least 3 times shorter than the sampling time, in order to ensure good linearity up to the measurement frequency. The sampling period is approximately 333 microseconds (μs). For R=1000Ω and C=100 nF, the filter time constant is expressed in Equations 9 and 10 and is less than ⅓rd of the sampling period.

$$\tau = RC \qquad \text{Equation 9}$$

$$\tau = (1000 \text{ }\Omega)(100 \text{ nF}) = 100 \text{ }\mu\text{s} \qquad \text{Equation 10}$$

where R is the RC filter resistance and C is the RC filter capacitance.

Energy Harvesting

One of the most important components in this line-mounted, line-powered micro-CPoW measurement device is the energy harvesting circuit, which is designed to utilize an identical or comparably-rated CT to that used in the current measuring circuit to extract sufficient electric power from the current flowing through the line-under-measurement to power the device. It is desirable to ensure that whatever circuit is employed in the energy harvesting block will operate over the widest possible range of line currents, and in particular, it is desirable to enable the circuit to operate down to as low an input line current as possible.

In order to realize these goals, a custom-designed switched-mode shunt regulator is developed specifically for this CPoW system. Shunt regulation is chosen in order to enable total utilization of CT current during periods of reduced line current, and this regulation is chosen to be performed in a switched-mode fashion (rather than in a linear regulation fashion) in order to minimize heat dissipation in the circuit elements at higher line current.

Figure 4:
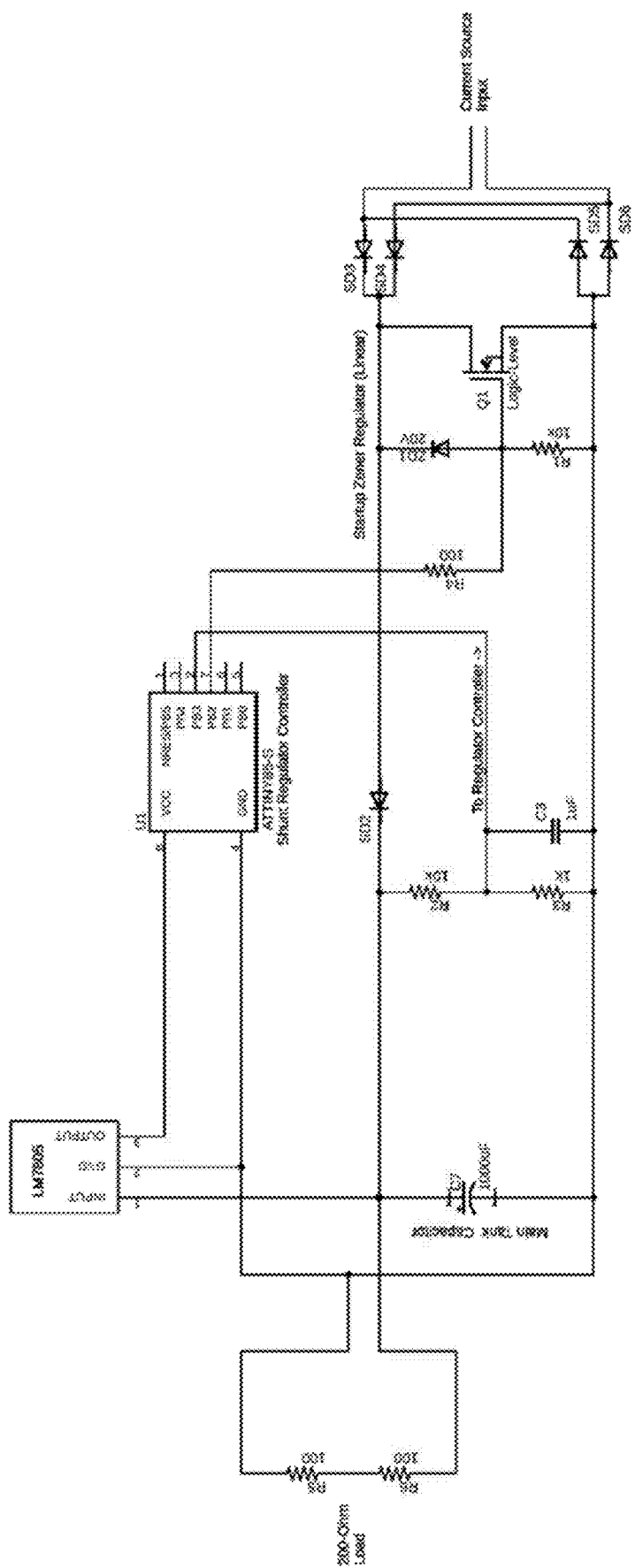
FIG. 4 is a schematic circuit diagram of an energy harvesting circuit for the micro-CPoW measurement device of FIG. 1.

FIG. 4 is a schematic circuit diagram of the energy harvesting circuit for the micro-CPoW measurement device 10 of FIG. 1. The energy harvesting circuit implements a switched-mode shunt regulator. Its basic control objective is to maintain a tank capacitor voltage window between two set values. This tank voltage is then available for use by subsequent post-regulation stages to derive the 5 V and 3.3 V supply voltages required by the other blocks within the CPoW system. This control has been implemented using a threshold-based hysteresis control strategy as such a mode of control works well with the inherently fixed-current nature of the output supply from the CT.

Figure 5:
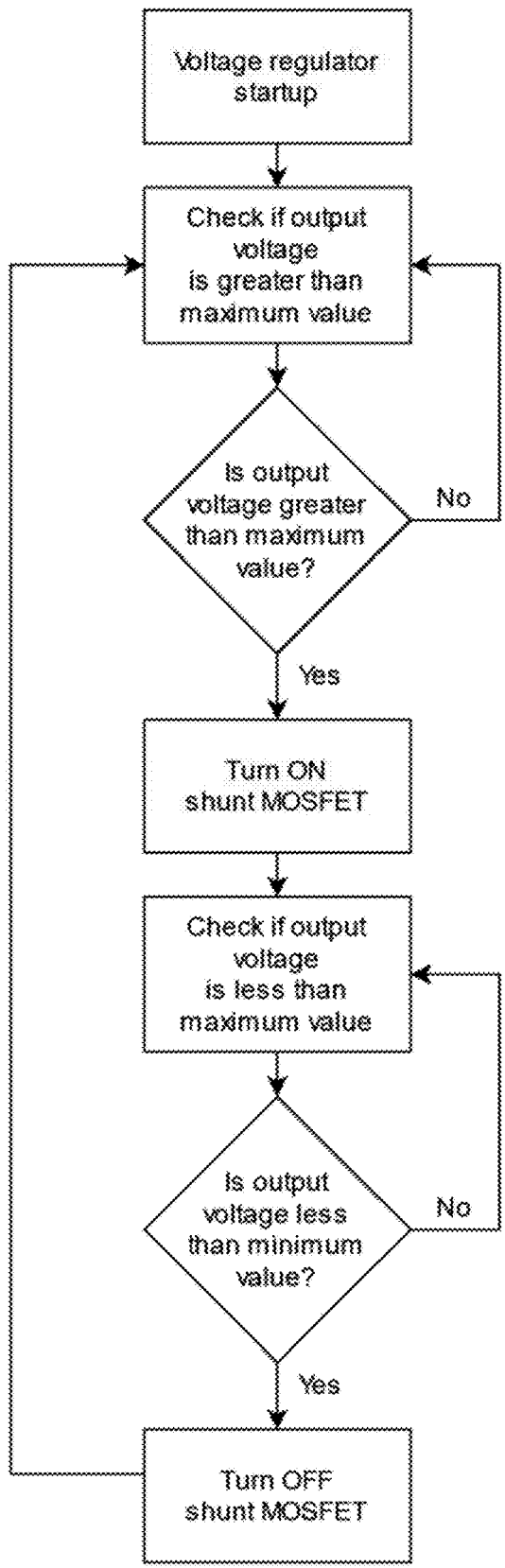
FIG. 5 is a flow diagram of control logic for the energy harvesting circuit of FIG. 4.

FIG. 5 is a flow diagram of control logic for the energy harvesting circuit of FIG. 4. When initially powered up, the low-cost dedicated microcontroller (ATTiny85) takes a short period of time (a few dozen milliseconds) to start up. During this period of time, current flows through the full-wave bridge rectifier, through the blocking diode, and into the tank capacitor. If the tank capacitor voltage exceeds the combined voltage of the 20V Zener diode and the ~5V rated gate voltage of the shunt MOSFET, the shunt MOSFET begins conducting in the linear region. Although a high power is dissipated by the MOSFET during this time, it occurs only briefly while the microcontroller is initializing. Once the microcontroller initializes, it begins regulating the tank capacitor voltage by turning on the MOSFET when the tank voltage exceeds a specified threshold (at most 25 V, with some safety margin to prevent Zener turn-on), and will turn off the MOSFET when the tank voltage falls below another threshold (at least 15 V). The blocking diode prevents the MOSFET from shorting out the tank capacitor when it is on, but still allows the MOSFET to divert current away from the capacitor.

The tank capacitor charging time is expressed as a function of average supply current in Equation 11 and the tank capacitor discharging time is expressed as a function of average load current in Equation 12.

$$t_{charge} = \frac{C_{tank}}{I_{in_{av}} - I_{load_{av}}} \Delta V \qquad \text{Equation 11}$$

$$t_{discharge} = \frac{C_{tank}}{I_{load_{av}}} \Delta V \qquad \text{Equation 12}$$

where $C_{tank}$ the capacitance value of the tank capacitor, $I_{in_{av}} - I_{load_{av}}$ is the average input current with the MOSFET switched off, $I_{load_{av}}$ is the average load current applied to the circuit, $\Delta V$ is the change in capacitor voltage during charging, $t_{charge}$ is the time to charge the capacitor, and $t_{discharge}$ is the time to discharge the capacitor.

The charging time for the 1,000 µF tank capacitor at the minimum test current of 250 mA, the load current of 100 mA, and the design voltage sweep of 10 V is expressed in Equation 13.

$$t_{charge} = \frac{1000 \; \mu F}{250 \text{ mA} - 100 \text{ mA}} (10 \text{ V}) = 66.6 \text{ ms} \qquad \text{Equation 13}$$

The charging time for the 1,000 µF tank capacitor at the maximum test current of 5,000 mA, the load current of 100 mA, and the design voltage sweep of 10 V is expressed in Equation 14.

$$t_{charge} = \frac{1000 \; \mu F}{5000 \text{ mA} - 100 \text{ mA}} (10 \text{ V}) = 2.04 \text{ ms} \qquad \text{Equation 14}$$

The discharging time for the 1000 µF tank capacitor at the load current of 100 mA and the design voltage sweep of 10 V is expressed in Equation 15.

$$t_{discharge} = \frac{1000 \; \mu F}{100 \text{ mA}} (10 \text{ V}) = 10 \text{ ms} \qquad \text{Equation 15}$$

Battery Energy Storage

It is well-known that the current throughout the electric power system varies widely both seasonally and throughout the day, both on the transmission level as well as the distribution level. Changes in customer demand, weather, and the presence of distributed renewable energy resources all play a role in net current flow in distribution conductors. Furthermore, fault events and unplanned power outages may interrupt line current entirely for extended periods of time. Even when line current is inadequate to supply the core functionality of the micro-CPoW measurement device 10, it is still desirable to enable the device to operate uninterrupted.

As a result of these requirements, the micro-CPoW measurement device 10 has been designed to operate with an onboard rechargeable battery for storing energy during periods of adequate line current and supplementing available power during periods of inadequate line current.

Figure 6:
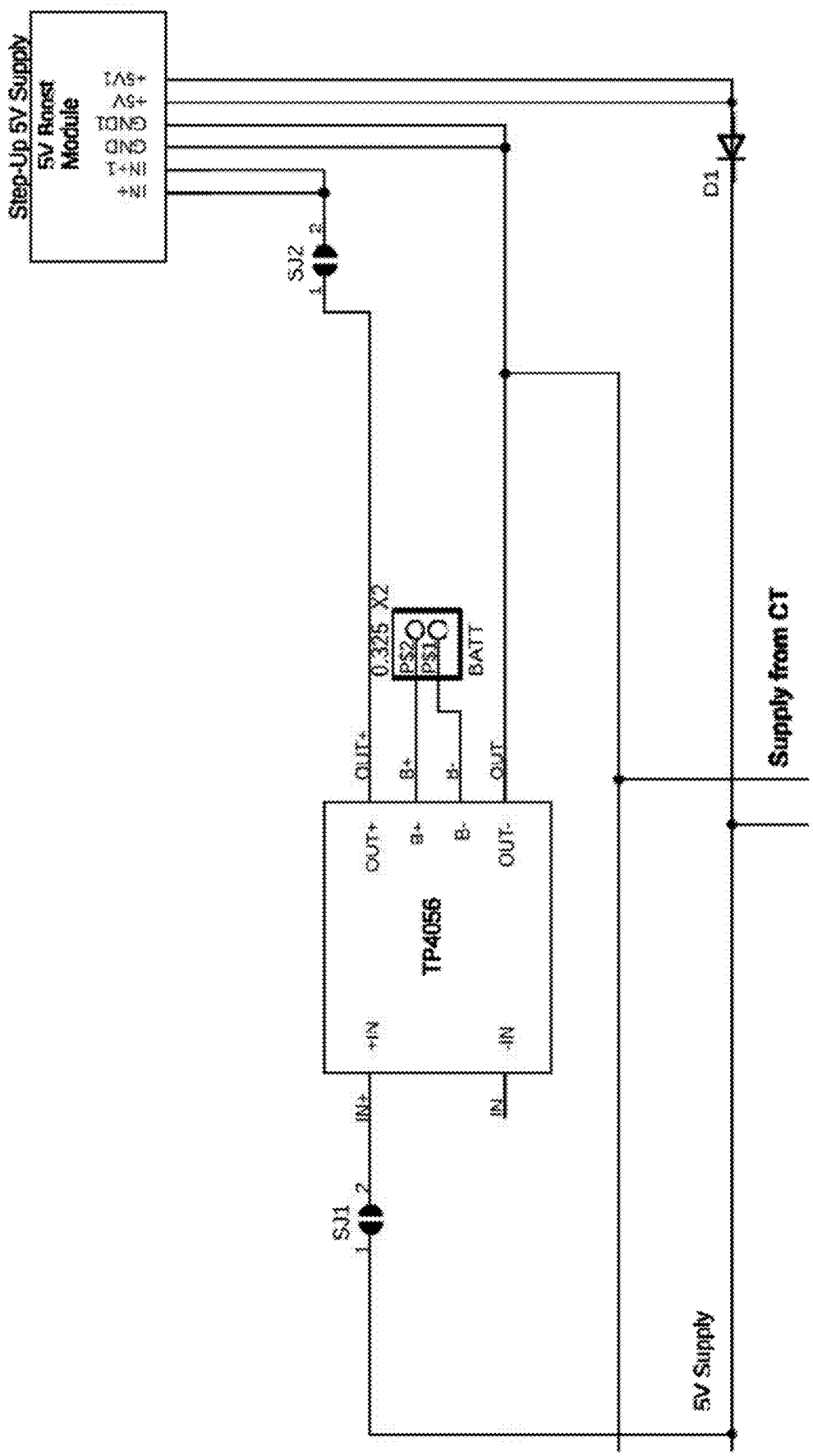
FIG. 6 is a schematic circuit diagram of a battery charging/discharging circuit for the micro-CPoW measurement device of FIG. 1.

FIG. 6 is a schematic circuit diagram of a battery charging/discharging circuit for the micro-CPoW measurement device 10 of FIG. 1. In an exemplary embodiment, the battery management system includes a TP4056 single-cell lithium-ion battery management board with overvoltage, undervoltage, and overcurrent protection, a MEZD41502A-A boost converter module, and a diode for passive voltage source selection.

When adequate power is available from the energy harvesting circuit to supply the micro-CPoW measurement device 10, a 5V supply is provided from the voltage regulation circuitry associated with the energy harvesting circuit. The small forward voltage drop associated with D1 in FIG. 6 ensures that power is preferentially drawn from the energy harvesting circuit when it is available. Under this condition, the TP4056 module provides a constant current, constant voltage (CC/CV) charging profile to an off-board lithium-ion battery, allowing the battery to be charged over time.

In the case where there is not sufficient power from the energy harvesting circuit to support the CPoW system, the voltage output of the energy-harvesting circuit drops, resulting in power instead being drawn from the boost converter module shown in FIG. 6. This handoff from harvested power to battery power is instantaneous due to the presence of the diode; hence, no active electronic switching is required to switch power sources.

Implementation for Evaluation

An exemplary implementation of the micro-CPoW measurement device 10 was designed based on the combination of all the above circuit blocks into a single PCB. The PCB was designed to carry all of the components required for the above-mentioned system blocks, and additionally includes mounting holes and board-to-wire interconnection terminals for connecting CTs and batteries to the board.

Figure 7:
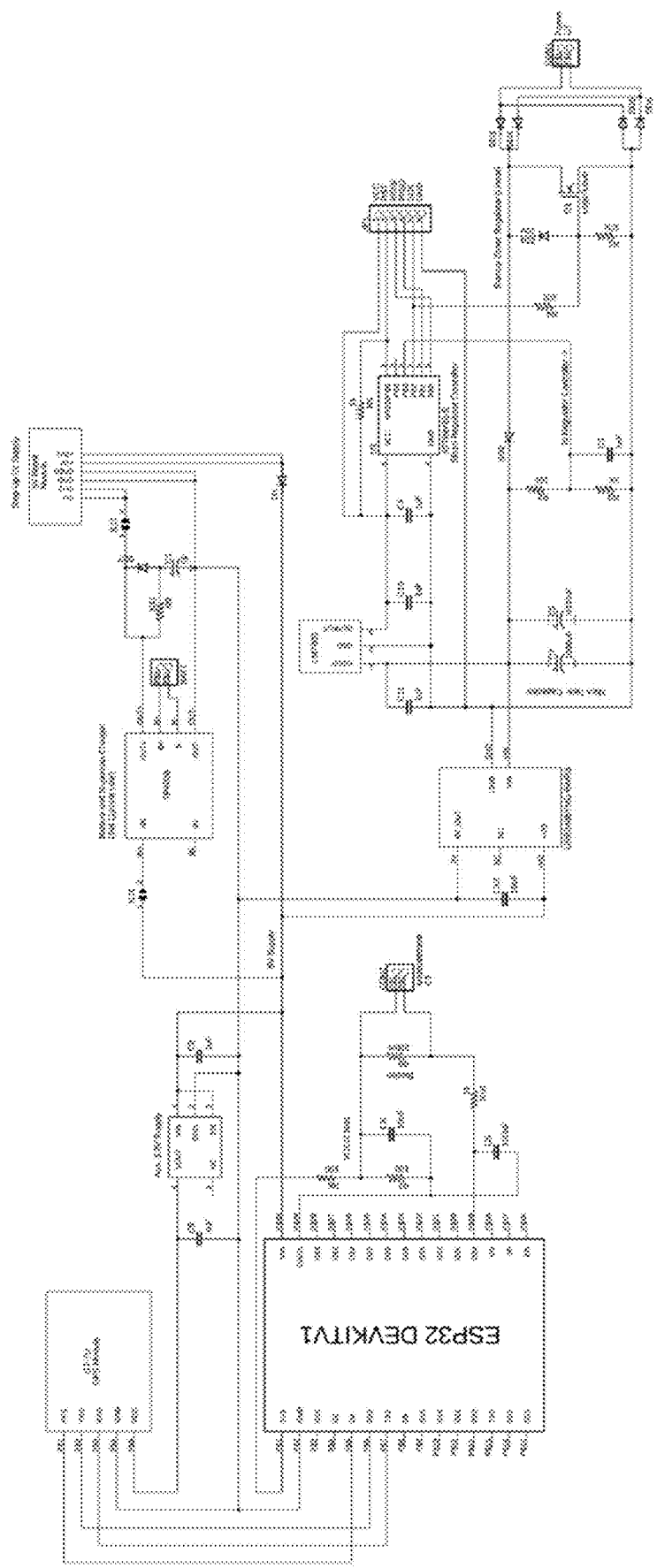
FIG. 7 is a schematic circuit diagram of the micro-CPoW measurement device of FIG. 1.

FIG. 7 is a schematic circuit diagram of the micro-CPoW measurement device 10 of FIG. 1.

Figure 8:
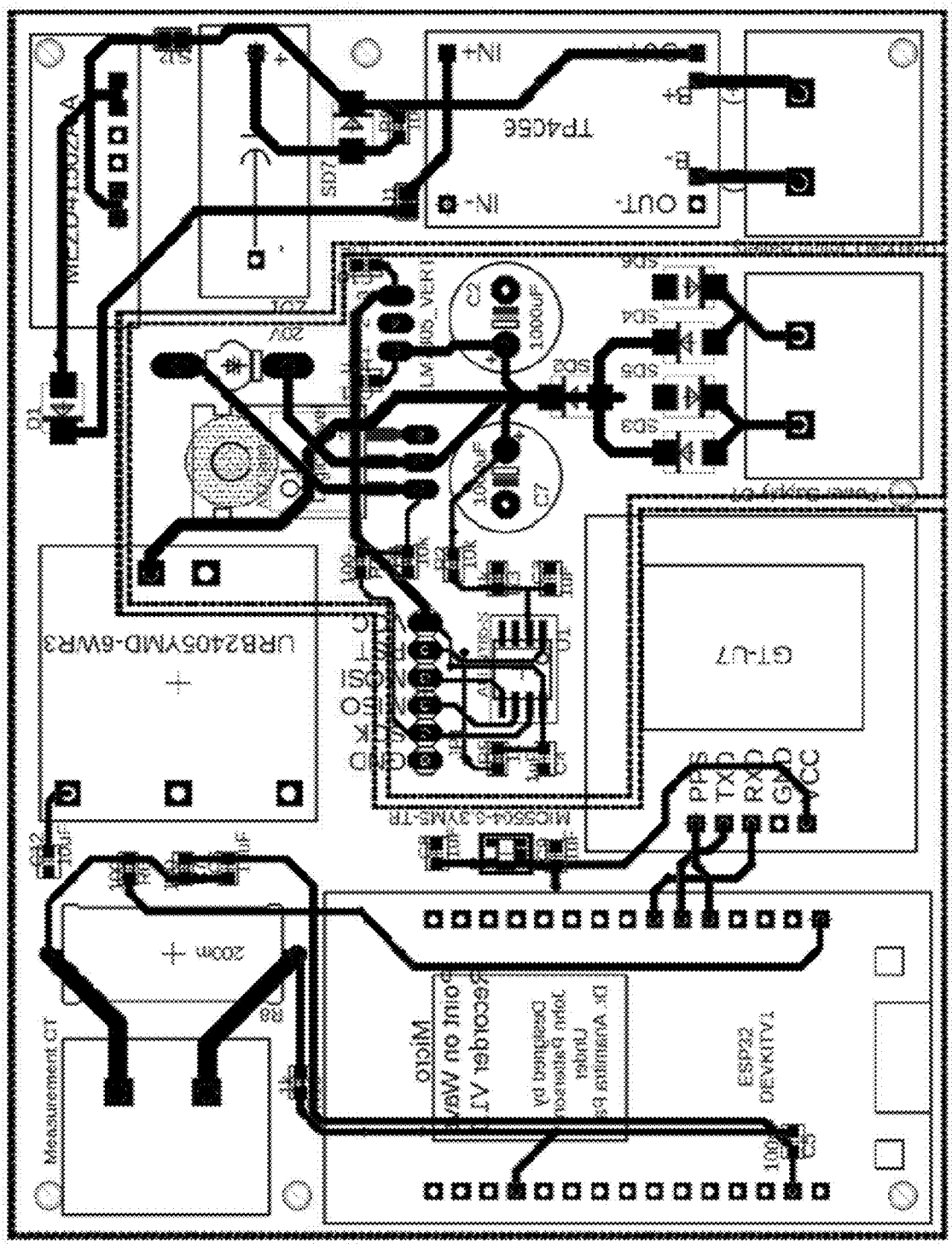
FIG. 8 is a schematic printed circuit board (PCB) layout diagram of an exemplary micro-CPoW measurement device according to FIG. 1.

FIG. 8 is a schematic printed circuit board (PCB) layout diagram of an exemplary micro-CPoW measurement device 10 according to FIG. 1.

Figure 9:
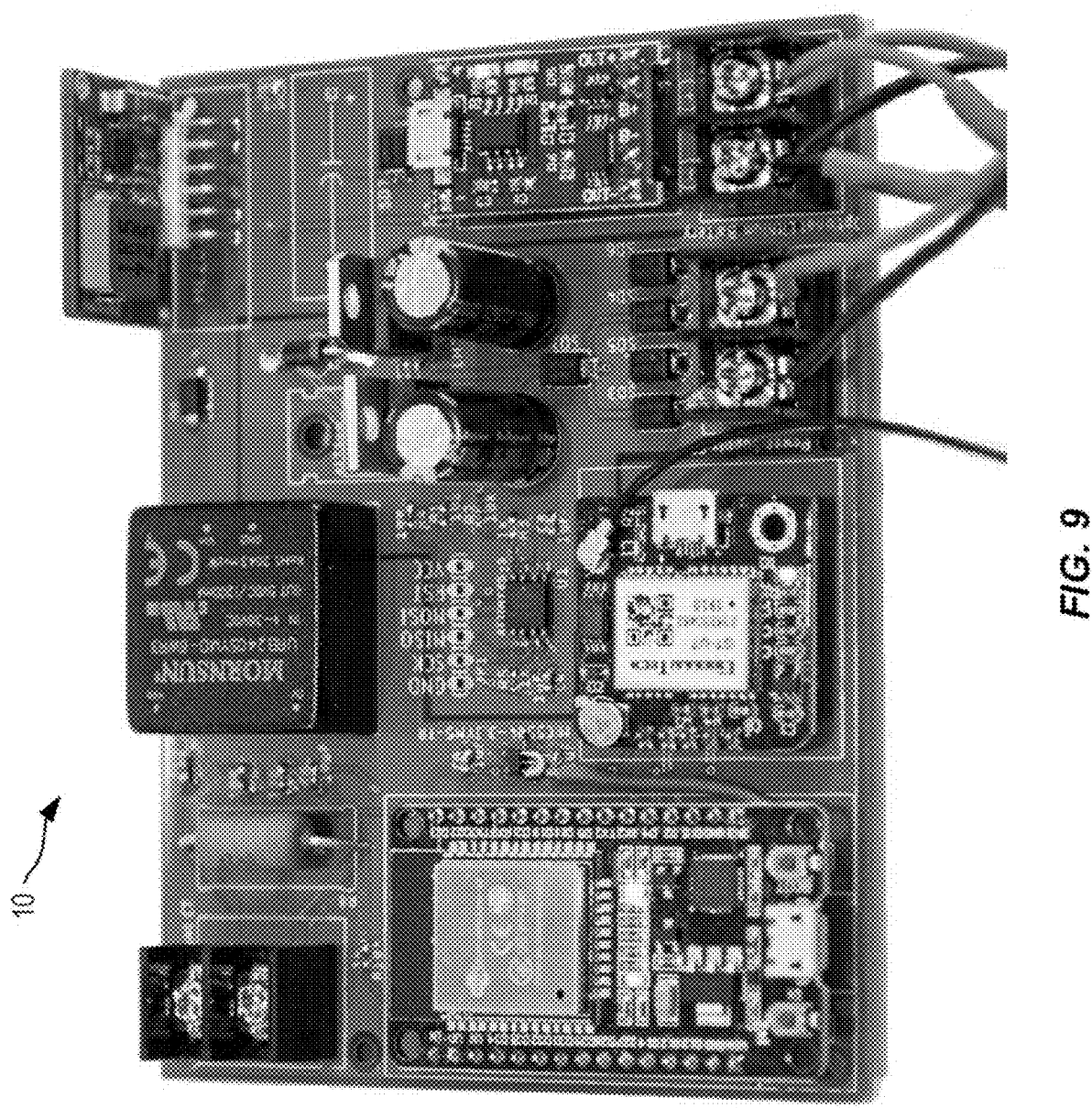
FIG. 9 is an image of an exemplary PCB implementation of the micro-CPoW measurement device of FIG. 1.

FIG. 9 is an image of an exemplary PCB implementation of the micro-CPoW measurement device 10 of FIG. 1.

Figure 10:
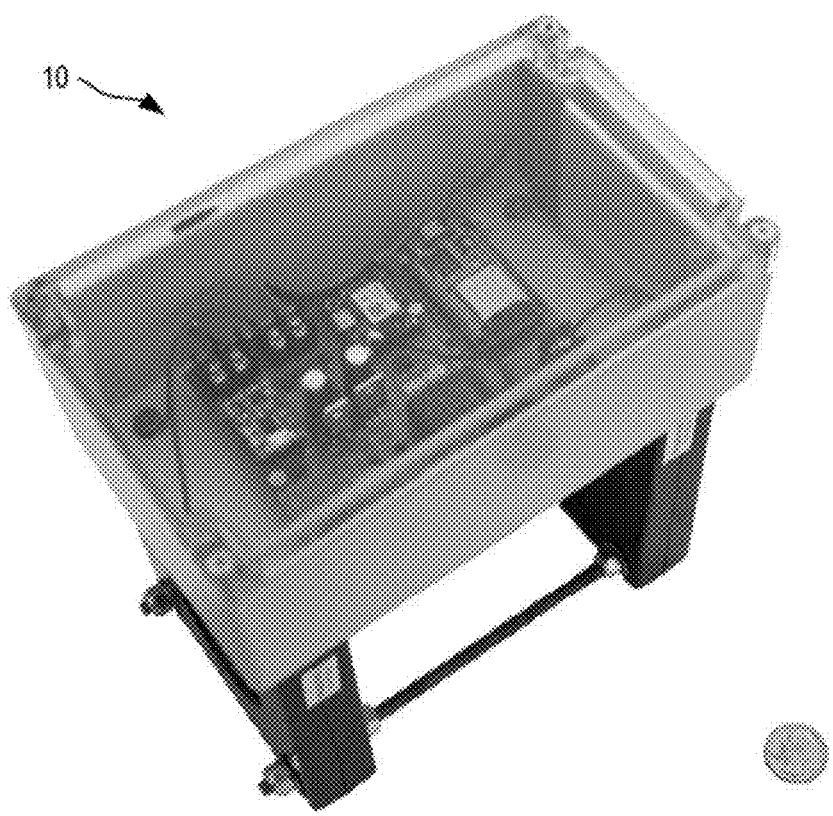
FIG. 10 is an image of another exemplary implementation of the micro-CPoW measurement device of FIG. 1 with CTs attached.

FIG. 10 is an image of another exemplary implementation of the micro-CPoW measurement device 10 of FIG. 1 with CTs attached. This illustrates a complete assembled unit used for evaluation of the micro-CPoW measurement device 10.

Accuracy Qualification

The lab is equipped with a Fluke 6135A high-precision calibration system designed to test PMUs according to IEEE C37.118-2011. The electrical waveforms generated by this calibrator are guaranteed by the manufacturer to meet 0.007% accuracy when supplying up to 10 A of output current.

Since the typical operating current of the micro-CPoW measurement device 10 is intended to range from 50 to 800 amperes, a typical operating current of 100 A was chosen as the current level at which to perform accuracy testing. A total of 10 turns of wire were wound through the CTs in order to simulate the effect of 10 times the applied current by the Fluke 6135A, which was set to an output current of 10 A. The measured ADC values, reported as integers by the ADC, were transformed into electric current values according to Equation 16, $$I = \left[ \left( \frac{A}{2^b} * V_{ref} \right) - V_{offset} \right] * \frac{T_{CT}}{R_{burden}} \qquad \text{Equation 16}$$

where I is the current measured by the recorder, A is the integer value reported by the ADC, b is the number of bits of the ADC, $V_{ref}$ is the voltage to which the ADC measurements are referenced, $V_{offset}$ is the DC offset voltage against which the CT's output voltage is added in order to retain measurement of both positive and negative CT currents by the ADC, $T_{CT}$ is the turns ratio of the CT, and $R_{burden}$ is the burden resistance applied to the CT.

The output samples obtained from the micro-CPoW measurement device 10 had a total harmonic distortion (THD) of approximately 0.55% and a measured current magnitude of 102% of the true value. The error in this value can be attributed to the effect of the 1% accuracy CT, the 1% accuracy burden resistor, and the unspecified ADC and reference voltage errors. Point-on-wave data obtained from the micro-CPoW measurement device 10 is close to sinusoidal, giving additional confirmation of the low THD value reported. These metrics are improved in other embodiments by calibration of the unit at the time of manufacture and/or temperature compensation methods, such as ovenization of the ADC.

Minimum Supply Current Characterization

Electric power lines in the distribution system often carry highly variable electric current levels in the course of a typical day. This means that at certain times of the day, the micro-CPoW measurement device 10 may be forced to operate with a very low line current compared to its maximum rated line current. As such, it was deemed necessary to characterize the minimum current at which the recorder will initially start up, and the current at which it shuts down when in service.

The micro-CPoW measurement device 10 was initially connected to a simulated power line capable of supplying between 0 and 100 A at 60 Hz. During the current characterization test, the line was operated in steady-state, and no disturbances or arcs were applied to the test bench setup. The current flowing through the simulated power line was gradually increased until the micro-CPoW measurement device 10 started up and began sending data. Upon a successful startup, the current was then ramped down until the micro-CPoW measurement device 10 shut down. This test was repeated three times for consistency, and the results are tabulated in Table 2. Based on these results, it is realized that the micro-CPoW measurement device 10 should be able to operate on any distribution conductor that consistently carries at least 25.0 A.

TABLE 2

Minimum Line Current Requirements

| | Minimum Startup Current (A) | Minimum Shutdown Current (A) |
|---|---|---|
| Test 1 | 25.0 | 18.0 |
| Test 2 | 24.0 | 18.3 |
| Test 3 | 24.5 | 18.5 |
| Average | 24.5 | 18.27 |

Simulated Power Line Tests and Arc Strike Testing

It can be argued that the most important time for a CPoW device to operate is during fault conditions, when electric power utilities need immediate information about incipient asset failure. Post-mortem analysis of asset degradation and faults also depends on the integrity and performance of measurements taken before, during, and after these faults. In order to ensure the correct performance of the micro-CPoW measurement device 10 in a realistic power system environment, an embodiment of the micro-CPoW measurement device 10 was placed on a test bench constructed to simulate the voltage and current conditions present in a real electric power distribution system.

The electric power line test bench used for this evaluation is equipped with an AC voltage source capable of delivering up to 4,400 volts AC at up to 500 mA short-circuit current at the surface of the conductor. Although the fault current delivered in this small-scale bench is orders of magnitude lower than the fault currents present in real power systems, it is capable of generating sustained electric arcs, which is one type of fault that occurs in the real electric distribution system.

The micro-CPoW measurement device 10 was mounted to the simulated power line. The simulated power line was energized with a pass-through current of 100 A and an applied voltage to ground of 4,400 V. The performance of the micro-CPoW measurement device 10 was evaluated by checking for dropped packets and monitoring the number of GPS satellites observed by the recorder during the testing. The results are shown in Table 3.

TABLE 3

Packet Loss and GPS Satellite Visibility

| | Steady-State 4400 V/100 A | Repetitive Arc Strike |
|---|---|---|
| Packet Loss | 1.23% | 1.31% |
| Maximum GPS Satellites | 10 | 8 |
| Minimum GPS Satellites | 5 | 6 |
| Median GPS Satellites | 7 | 8 |

Figure 11:
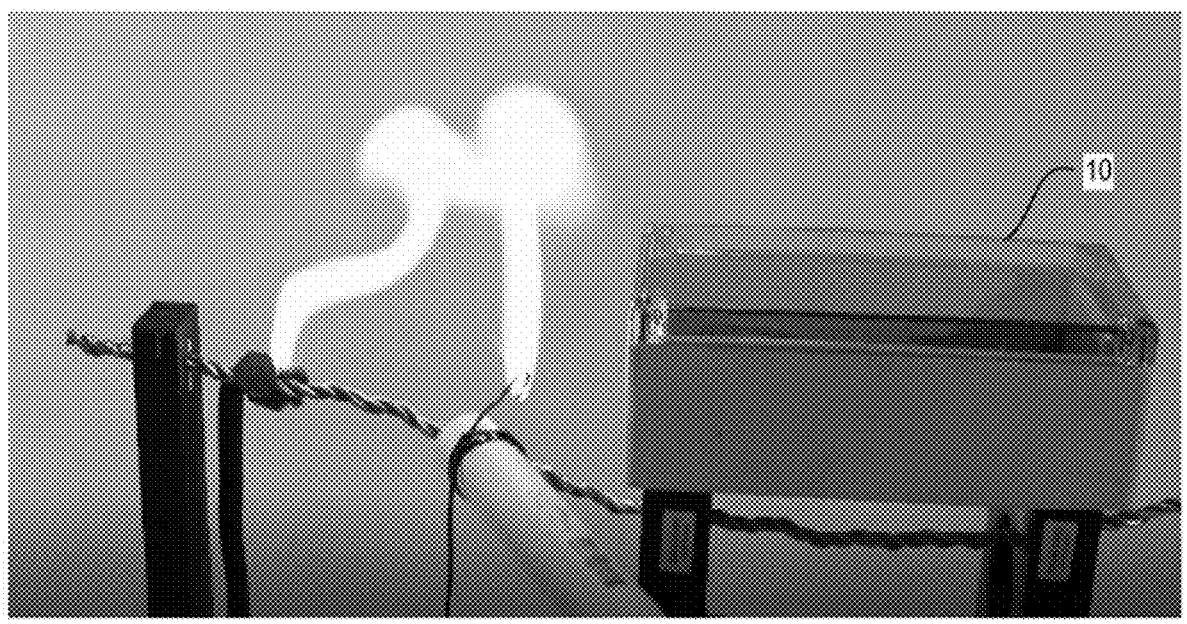
FIG. 11 is an image of the micro-CPoW measurement device of FIG. 5 being subjected to a nearby arc flash test.

FIG. 11 is an image of the micro-CPoW measurement device 10 of FIG. 5 being subjected to a nearby arc flash test. The unit depicted in FIG. 11 is subjected to experimental arc-flash conditions such as those that might be encountered in a real power system. As a final test, an electric arc was instantiated on the simulated power line by a wire connected to an insulated "hot work stick" and was drawn across the micro-CPoW measurement device 10 transformers in order to evaluate if damage to the device or to the power line was sustained. The measurements taken by the micro-CPoW measurement device 10 during the arc were also scrutinized carefully in order to determine if any anomalous behavior was detected in response to the induced fault (see Table 3 and FIG. 11).

The packet drop-rate, minimum and maximum number of satellites visible by the GPS module during the steady-state and the repetitive arc striking tests are tabulated in Table 3. Based on the results shown in Table 3, it can be surmised that the effects of electrical arcs in close proximity to the micro-CPoW measurement device 10 do not severely affect its performance.

Method for Measuring Line Current

Figure 12:
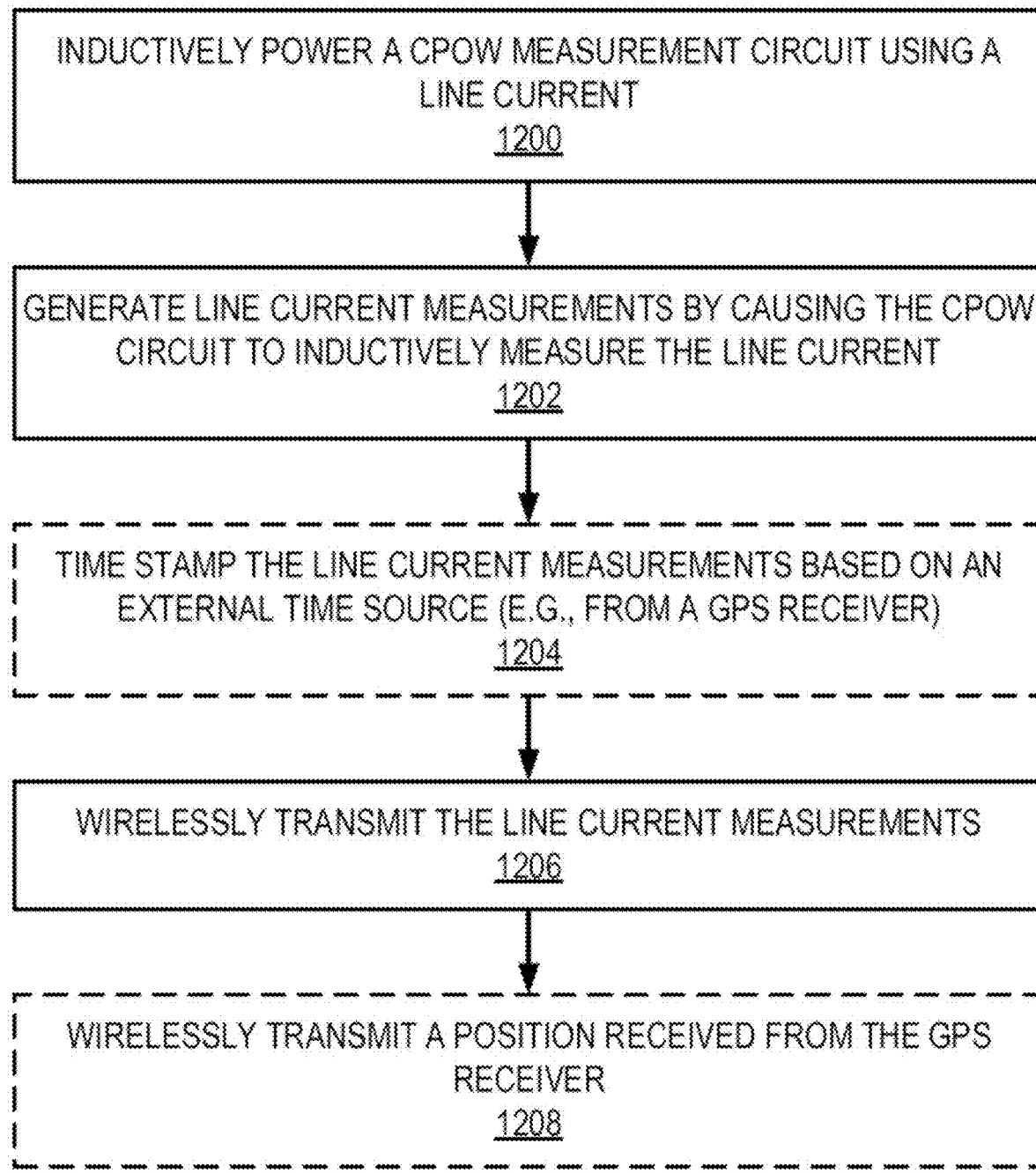
FIG. 12 is a flow diagram illustrating a process for measuring line current in an electric power system.

FIG. 12 is a flow diagram illustrating a process for measuring line current in an electric power system. Dashed boxes represent optional steps. The process begins at operation 1200, with inductively powering a CPoW measurement circuit using a line current. The process continues at operation 1202, with generating line current measurements by causing the CPoW circuit to inductively measure the line current. The process optionally continues at operation 1204, with time stamping the line current measurements based on an external time source. In an exemplary aspect, time indicators are received from the external time source via a GPS receiver.

The process continues at operation 1206, with wirelessly transmitting the line current measurements. In an exemplary aspect, the line current measurements are transmitted to a network device, such as a central database of the electric power system. The process optionally continues at operation 1208, with wirelessly transmitting a position received from the GPS receiver.

Although the operations of FIG. 12 are illustrated in a series, this is for illustrative purposes and the operations are not necessarily order dependent. Some operations may be performed in a different order than that presented. Further, processes within the scope of this disclosure may include fewer or more steps than those illustrated in FIG. 12. In some embodiments, the line current measurements from the micro-CPoW measurement device are wirelessly received and displayed on a computing system.

Computer System

Figure 13:
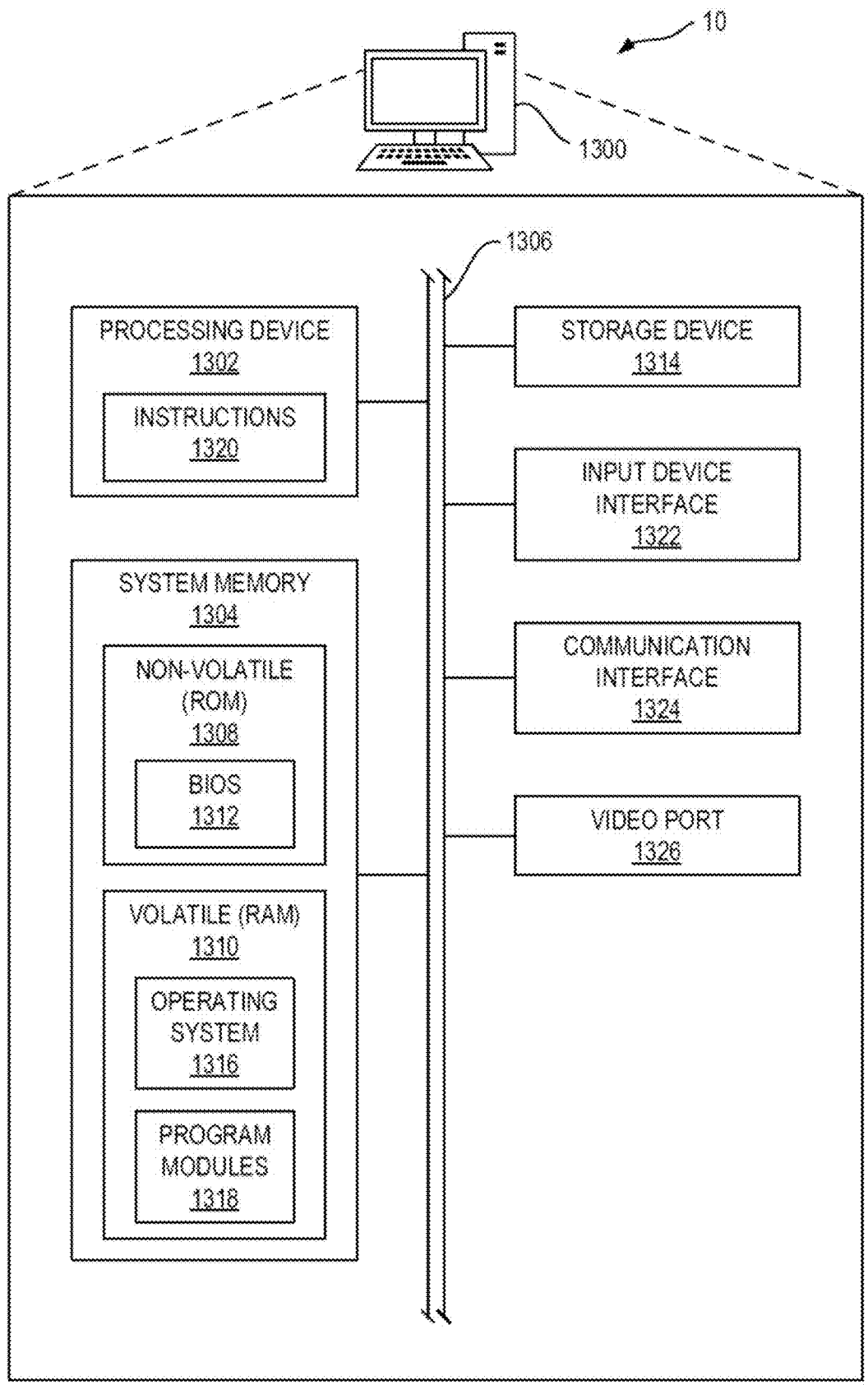
FIG. 13 is a block diagram of a computer system incorporating or implementing the micro-CPoW measurement device according to embodiments disclosed herein.

FIG. 13 is a block diagram of a computer system 1300 incorporating or implementing the micro-CPoW measurement device 10 according to embodiments disclosed herein. In some embodiments, the micro-CPoW measurement device 10 and/or a utility monitoring system in communication with the micro-CPoW measurement device 10, is implemented in the computer system 1300, which comprises any computing or electronic device capable of including firmware, hardware, and/or executing software instructions that could be used to perform any of the methods or functions described above. In this regard, the computer system 1300 may be a circuit or circuits included in an electronic board card, such as a PCB, a server, a personal computer, a desktop computer, a laptop computer, an array of computers, a personal digital assistant (PDA), a computing pad, a mobile device, or any other device, and may represent, for example, a server or a user's computer.

The exemplary computer system 130 in this embodiment includes a processing device 1302 or processor, a system memory 1304, and a system bus 1306. The system memory 1304 may include non-volatile memory 1308 and volatile memory 1310. The non-volatile memory 1308 may include read-only memory (ROM), erasable programmable read-only memory (EPROM), electrically erasable programmable read-only memory (EEPROM), and the like. The volatile memory 1310 generally includes random-access memory (RAM) (e.g., dynamic random-access memory (DRAM), such as synchronous DRAM (SDRAM)). A basic input/output system (BIOS) 1312 may be stored in the non-volatile memory 1308 and can include the basic routines that help to transfer information between elements within the computer system 1300.

The system bus 1306 provides an interface for system components including, but not limited to, the system memory 1304 and the processing device 1302. The system bus 1306 may be any of several types of bus structures that may further interconnect to a memory bus (with or without a memory controller), a peripheral bus, and/or a local bus using any of a variety of commercially available bus architectures.

The processing device 1302 represents one or more commercially available or proprietary general-purpose processing devices, such as a microprocessor, central processing unit (CPU), or the like. More particularly, the processing device 1302 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 1302 is configured to execute processing logic instructions for performing the operations and steps discussed herein.

In this regard, the various illustrative logical blocks, modules, and circuits described in connection with the embodiments disclosed herein may be implemented or performed with the processing device 1302, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 1302 may be a microprocessor, or may be any conventional processor, controller, microcontroller, or state machine. The processing device 1302 may also be implemented as a combination of computing devices (e.g., a combination of a DSP and a microprocessor, a plurality of microprocessors, one or more microprocessors in conjunction with a DSP core, or any other such configuration).

The computer system 1300 may further include or be coupled to a non-transitory computer-readable storage medium, such as a storage device 1314, which may represent an internal or external hard disk drive (HDD), flash memory, or the like. The storage device 1314 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system 1316 and any number of program modules 1318 or other applications can be stored in the volatile memory 1310, wherein the program modules 1318 represent a wide array of computer-executable instructions corresponding to programs, applications, functions, and the like that may implement the functionality described herein in whole or in part, such as through instructions 1320 on the processing device 1302. The program modules 1318 may also reside on the storage mechanism provided by the storage device 1314. As such, all or a portion of the functionality described herein may be implemented as a computer program product stored on a transitory or non-transitory computer-usable or computer-readable storage medium, such as the storage device 1314, volatile memory 1310, non-volatile memory 1308, instructions 1320, and the like. The computer program product includes complex programming instructions, such as complex computer-readable program code, to cause the processing device 1302 to carry out the steps necessary to implement the functions described herein.

An operator, such as the user, may also be able to enter one or more configuration commands to the computer system 1300 through a keyboard, a pointing device such as a mouse, or a touch-sensitive surface, such as the display device, via an input device interface 1322 or remotely through a web interface, terminal program, or the like via a communication interface 1324. The communication interface 1324 may be wired or wireless and facilitate communications with any number of devices via a communications network in a direct or indirect fashion. An output device, such as a display device, can be coupled to the system bus 1306 and driven by a video port 1326. Additional inputs and outputs to the computer system 1300 may be provided through the system bus 1306 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

What is claimed is:

1. A self-contained micro-continuous point-on-wave (CPoW) measurement device, comprising:
    an inductive energy harvesting circuit configured to power the micro-CPoW measurement device from a power line;
    a CPoW measurement circuit configured to generate line current measurements from the power line;
    a wireless transmitter;
    a global positioning system (GPS) receiver configured to receive a timing signal configured for time-synchronization;
    a battery; and
    a processor in communication with the CPoW measurement circuit and the wireless transmitter and configured to cause the wireless transmitter to transmit the line current measurements to a network device;
    wherein the micro-CPoW measurement device is arc flash resistant.

2. The micro-CPOW measurement device of claim 1, further comprising a first current transformer coupled to the inductive energy harvesting circuit.

3. The micro-CPoW measurement device of claim 2, further comprising a second current transformer coupled to the CPOW measurement circuit.

4. The micro-CPOW measurement device of claim 1, wherein the micro-CPoW measurement device comprises a printed circuit board (PCB).

5. The micro-CPOW measurement device of claim 1, wherein the micro-CPoW measurement device is time-synchronized.

6. The micro-CPOW measurement device of claim 1, wherein the micro-CPoW measurement device is configured to measure line current at a frequency of at least 1,000 samples per second.

7. The micro-CPOW measurement device of claim 1, wherein the micro-CPoW measurement device is configured to measure line current at an 8 bit or greater resolution.

8. The micro-CPOW measurement device of claim 1, wherein the micro-CPoW measurement device is configured to measure in real time instantaneous electric current flowing through a distribution line conductor, incipient fault conditions, power quality, millisecond-scale transient events, higher-order harmonic content, sudden phase-step events, or transient events.

9. The micro-CPOW measurement device of claim 1, wherein the micro-CPoW measurement device is configured to be mounted onto or proximate a power line.

10. The micro-CPOW measurement device of claim 1, wherein the micro-CPoW measurement device is configured to operate free from ground or any other voltage reference.

11. The micro-CPOW measurement device of claim 1, further comprising accessible analog-to-digital converter (ADC) inputs and digital contact inputs.

12. The micro-CPOW measurement device of claim 1, wherein the micro-CPoW measurement device is enclosed in a weather-resistant package.

13. A micro-continuous point-on-wave (CPoW) measurement system, comprising:
    the micro-CPOW measurement device of claim 1, wherein the device is configured to inductively power the continuous point-on-wave (CPoW) measurement circuit using the line current, generate line current measurements by causing the CPOW measurement circuit to inductively measure the line current, and wirelessly transmit the line current measurements; and
    a computing system communicatively connected to the micro-CPoW measurement device, comprising a processor and a non-transitory computer-readable medium with instructions stored thereon, which when executed by a processor, perform steps comprising:
    wirelessly receiving line current measurements from the micro-CPoW measurement device; and
    displaying the line current measurements.

14. The micro-CPOW measurement device of claim 1, wherein the timing signal comprises a 1 pulse-per-second (1 PPS) signal.

15. The micro-CPOW measurement device of claim 14, wherein the micro-CPoW measurement device is configured to perform nanosecond-precision time synchronization.

16. The micro-CPOW measurement device of claim 15, where the wireless transmitter is configured to transmit data continuously.

17. The micro-CPOW measurement device of claim 16, further comprising a diode configured to passively select a voltage source comprising the battery or the inductive energy harvesting circuit.

18. A method for measuring line current in an electric power system, the method comprising:
    inductively powering a self-contained micro-CPoW measurement device including a continuous point-on-wave (CPoW) measurement circuit using the line current;
    generating line current measurements by causing the CPOW measurement circuit to inductively measure the line current;
    time stamping the line current measurements based on time indicators received over a first network via a global positioning system (GPS) receiver of the micro-CPoW measurement device; and
    wirelessly transmitting the line current measurements over a second network different from the first.

19. The method of claim 18, further comprising wirelessly transmitting a position received from the GPS receiver.

* * * * *